(12) United States Patent
Wu

(10) Patent No.: US 10,581,122 B2
(45) Date of Patent: Mar. 3, 2020

(54) CHARGE AND DISCHARGE CONTROL APPARATUS AND METHOD FOR AN ENERGY STORAGE THAT PROVIDES MULTIPLE SERVICES

(71) Applicant: Institute For Information Industry, Taipei (TW)

(72) Inventor: Jui-Ming Wu, New Taipei (TW)

(73) Assignee: Institute For Information Industry, Taipei (TW)

( * ) Notice: Subject to any disclaimer, the term of this patent is extended or adjusted under 35 U.S.C. 154(b) by 94 days.

(21) Appl. No.: 15/870,596

(22) Filed: Jan. 12, 2018

(65) Prior Publication Data

US 2019/0148780 A1 May 16, 2019

(30) Foreign Application Priority Data

Nov. 10, 2017 (TW) .............................. 106138978 A

(51) Int. Cl.
*H01M 10/44* (2006.01)
*H01M 10/42* (2006.01)
(Continued)

(52) U.S. Cl.
CPC ...... *H01M 10/425* (2013.01); *G01R 31/3644* (2013.01); *G06Q 50/06* (2013.01);
(Continued)

(58) Field of Classification Search
CPC .............. H01M 10/425; H01M 10/441; G01R 31/3644; G06Q 50/06; H02J 3/32; H02J 7/0004; H02J 7/0013; H02J 7/0068
(Continued)

(56) References Cited

U.S. PATENT DOCUMENTS

| | | | |
|---|---|---|---|
| 2013/0274935 A1* | 10/2013 | Deshpande | H02J 3/28 700/291 |
| 2014/0039710 A1 | 2/2014 | Carter et al. | |
| 2015/0261239 A1* | 9/2015 | Zhang | G06O 30/08 700/291 |

FOREIGN PATENT DOCUMENTS

| | | |
|---|---|---|
| JP | 2012147600 A | 8/2012 |
| TW | 201251264 A1 | 12/2012 |

OTHER PUBLICATIONS

Office Action to the corresponding Taiwan Patent Application No. 106138978 rendered by the Taiwan Intellectual Property Office (TIPO) dated May 21, 2018, 7 pages (including English translation).

* cited by examiner

*Primary Examiner* — Zixuan Zhou
(74) *Attorney, Agent, or Firm* — Skaar Ulbrich Macari, P.A.

(57) ABSTRACT

A charge and discharge control apparatus and method are provided. The charge and discharge control apparatus decides multiple discharge time intervals and multiple discharge power values for an energy storage according to a predicted load curve and a peak shaving threshold and decides multiple charge time intervals and multiple charge power values for the energy storage according to the predicted load curve and a customer base line. The peak shaving threshold is between a contracted capacity and a peak value of the predicted load curve. A difference between the peak value and the peak shaving threshold is not greater than a maximum discharge power of the energy storage. The customer base line is between the contracted capacity and a valley value of the predicted load curve. A difference between the customer base line and the valley value is not greater than a maximum charge power of the energy storage.

24 Claims, 17 Drawing Sheets

(51) Int. Cl.
  *H02J 7/00* (2006.01)
  *H02J 3/32* (2006.01)
  *G01R 31/36* (2020.01)
  *G06Q 50/06* (2012.01)
  *H02J 3/14* (2006.01)
  *H02J 7/02* (2016.01)
(52) U.S. Cl.
  CPC ............ *H01M 10/441* (2013.01); *H02J 3/14* (2013.01); *H02J 3/32* (2013.01); *H02J 7/0004* (2013.01); *H02J 7/0013* (2013.01); *H02J 7/0068* (2013.01); *H02J 7/022* (2013.01); *H02J 2003/143* (2013.01); *H02J 2003/146* (2013.01)
(58) Field of Classification Search
  USPC .................................................. 320/101, 136
  See application file for complete search history.

| Candidate combination | | First stage | Second stage | Third stage | Fourth stage |
|---|---|---|---|---|---|
| CBL$_0$ | PKS$_0$ | No solution | | | |
| | PKS$_1$ | No solution | | | |
| | PKS$_2$ | No solution | | | |
| | PKS$_3$ | No solution | | | |
| | PKS$_4$ | No solution | | | |
| CBL$_1$ | PKS$_0$ | | No solution | | |
| | PKS$_1$ | | No solution | | |
| | PKS$_2$ | | S$_1$ | | |
| CBL$_2$ | PKS$_0$ | | | No solution | |
| | PKS$_1$ | | | S$_2$ | |
| CBL$_3$ | PKS$_0$ | | | | S$_3$ |

FIG. 1I

CHARGE AND DISCHARGE CONTROL APPARATUS AND METHOD FOR AN ENERGY STORAGE THAT PROVIDES MULTIPLE SERVICES

PRIORITY

This application claims priority to Taiwan Patent Application No. 106138978 filed on Nov. 10, 2017, which is hereby incorporated by reference in its entirety.

FIELD

The present invention relates to a charge and discharge control apparatus and method. More particularly, the present invention relates to a charge and discharge control apparatus and method for a battery energy storage system (BESS).

BACKGROUND

Electricity charges collected by electric power companies from customers are generally divided into two categories, i.e., the energy charge and the demand charge. The energy charge is the charge of the total electricity consumed by the customer during a certain period of time (e.g., during a billing month), wherein the unit of the energy is charged by kWh (i.e. kilowatt-hour). With respect to the energy charge, the electric power companies usually implement time-dependent electricity price systems (i.e., setting different electricity price rates for different time intervals) and, thereby, guiding the customers to reduce the electricity consumption during the peak time interval. As to the demand charge, it is the charge collected by the electric power company according to a maximum demand of the customer during a certain period of time (e.g., during a billing month), wherein the unit of the demand is charged by kW. Different electric power companies calculate "demand" in different ways and, generally, the demand is calculated according to the average electricity consumption power during a certain time interval (e.g., 15 minutes, or longer or shorter than 15 minutes). The electric power company collects a fixed demand charge according to a contracted capacity signed with the customer in advance. The electric power company will collect an additional charge if the maximum demand of the real power consumption of the customer exceeds the contracted capacity. By setting the contracted capacity and collecting the demand charge, the electric power company can more easily control the peak load of the overall electric power system.

Although the electric power companies can control the power supply conditions and the load of the overall electric power system by collecting energy charges and demand charges, sometimes power supply remains tight. To solve this problem, many electric power companies adopt a demand response mechanism. Briefly speaking, if an electric power company predicts that a certain time interval in a certain day will be a time interval of peak demand, the electric power company takes that day as a scheduling day and that time interval of that day as a scheduling time interval. The duration of the scheduling time interval is determined by the electric power company and is not shorter than a minimum load-reduction time interval (e.g., 2 hours). The electric power company will request customers to reduce their maximum consumed power value within the scheduling time interval of the scheduling day. The electric power company calculates a customer base line according to the maximum consumed power values of the customers within the same time interval in past several days. If the maximum consumed power value within the scheduling time interval of the scheduling day is lower than the customer base line, the customer base line minus the maximum consumed power value within the scheduling time interval of the scheduling day is the load-reduction amount of the demand-response (i.e., the reduced maximum consumed power) of the customers within the scheduling time interval of the scheduling day. Thereafter, the electric power company calculates the reward of the customer according to the load-reduction amounts of the demand-response.

Some customers utilize energy storages to reduce the dependence on the power supply systems of the electric power companies, which also reduce the load of the power supply systems of the electric power companies. Currently, energy storages are usually utilized to provide only one single service (e.g., only the service for load shifting from peak hours to off-peak hours, only the service for peak load shaving, or only the service for load reduction of demand-response) because the charge and discharge capacities of the energy storages are limited, different services have different requirements, and both the power supply conditions of the power supply systems of the electric power companies and the power consumption conditions of the customers change from time to time. When providing only one single service, the energy storages are idle in many time intervals of the day.

Specifically, if an energy storage is used for load shifting from peak hours to off-peak hours (i.e., the energy storage is charged in off-peak hours where the electricity price rate is lower, and discharged in peak hours where the electricity price rate is higher) only, the energy storage stops its operation after discharging in the peak hours. If an energy storage is used for peak load shaving (i.e., the energy storage is discharged when the consumed power of the customer exceeds the contracted power) only, the energy storage operates momentarily in a day because the time intervals during which the consumed power of the customer exceeds the contracted power are usually very short. Furthermore, if an energy storage is used only for load reduction of demand-response (i.e., the energy storage is discharged within the scheduling time interval of the scheduling day), the energy storage will not operate within the non-scheduling time intervals of the scheduling day as well as the normal days.

Since the energy storages provide only one single service, they are idle in many time intervals of the day. As the energy storages cannot be fully utilized, solving various problems associated with power consumption together to obtain more benefits (i.e., considering how to reduce the energy charge, reduce the demand charge, and obtain rewards from load reduction of demand-response together) cannot be achieved. Meanwhile, the load of the power supply systems of the electric power companies in the time intervals of peak demand cannot be significantly reduced.

Accordingly, there is an urgent need for a charge and discharge control technology that can control an energy storage to provide multiple services so as to assist customers in load shifting from peak hours to off-peak hours, peak load shaving, and load reduction and addition appropriately and timely according to the demand response mechanism to obtain more benefits and reduce the overall peak load of the power supply systems of the electric power companies.

SUMMARY

The disclosure includes a charge and discharge control apparatus. The charge and discharge control apparatus comprises an interface and a processing unit. The interface is electrically connected to an electric circuit and the processing unit. The processing unit is configured to decide a plurality of discharge time intervals of an energy storage and a discharge power value of each of the discharge time intervals according to a peak shaving threshold and a predicted load curve of the electric circuit in an adjustment time interval. The processing unit is also configured to decide a plurality of charge time intervals of the energy storage and a charge power value of each of the charge time intervals according to a customer base line and the predicted load curve. The peak shaving threshold is between a contracted capacity and a peak of the predicted load curve, wherein a difference between the peak and the peak shaving threshold is not greater than a maximum discharge power of the energy storage. The customer base line is between the contracted capacity and a valley value of the predicted load curve, wherein a difference between the customer base line and the valley value is not greater than a maximum charge power of the energy storage.

The disclosure also includes a charge and discharge control method, which is adapted for an electronic computing apparatus. The electronic computing apparatus is adapted to control an energy storage and is connected to an electric circuit. The charge and discharge control method comprises the following steps: (a) deciding a plurality of discharge time intervals of an energy storage and a discharge power value of each of the discharge time intervals according to a peak shaving threshold and a predicted load curve of the electric circuit in an adjustment time interval, wherein the peak shaving threshold is between a contracted capacity and a peak of the predicted load curve and a difference between the peak and the peak shaving threshold is not greater than a maximum discharge power of the energy storage and (b) deciding a plurality of charge time intervals of the energy storage and a charge power value of each of the charge time intervals according to a customer base line and the predicted load curve, wherein the customer base line is between the contracted capacity and a valley value of the predicted load curve and a difference between the customer base line and the valley value is not greater than a maximum charge power of the energy storage.

The charge and discharge control technology (at least including the charge and discharge control apparatus and method) can arrange the energy storage to discharge within an adjustment time interval on a normal day according to a peak shaving threshold so as to reduce the actual consumed power within the adjustment time interval and, thereby, reduce the demand charge to be paid by the customer. The charge and discharge control technology can arrange the energy storage to be charged within the adjustment time interval on a normal day according to a customer base line so as to increase the actual consumed power within the adjustment time interval and, thereby, the customer base line used in a future scheduling day will be raised and more rewards can be obtained due to a larger demand response load reduction amount. Because the charge and discharge control technology provided in the present invention utilizes the peak shaving threshold and the customer base line to control charge and discharge of the energy storage within the adjustment time interval on a normal day, load shifting from peak hours to off-peak hours can also be achieved (i.e., the energy storage is arranged to discharge in peak hours and to charge in off-peak hours) which leads to reduction of the energy charge of the customer. Moreover, the charge and discharge control technology may further utilize a residual energy release mechanism on a normal day to enhance the aforementioned various effects. According to the above descriptions, the charge and discharge control technology can enable the energy storage to provide multiple services (i.e., load shifting from peak hours to off-peak hours and peak load shaving) on a normal day so that more benefits (i.e., reducing the energy charge and the demand charge) can be obtained by customers and load of the power supply systems of the electric power companies within time intervals of peak demand can be reduced.

The charge and discharge control technology (at least including the charge and discharge control apparatus and method) can arrange the energy storage to discharge within an adjustment time interval on a scheduling day according to another peak shaving threshold so as to reduce the actual consumed power within the adjustment time interval and, thereby, reduce the demand charge to be paid by the customer. The charge and discharge control technology can further utilize a residual energy release mechanism on a scheduling day to arrange the energy storage to release residual energy within a scheduling time interval and, thereby, obtain rewards regarding demand response load reduction from the electric power companies. The charge and discharge control technology may further arrange the energy storage to charge within the adjustment time interval on a scheduling day according to another customer base line so as to increase the actual consumed power within the adjustment time interval and, thereby, the customer base line used in other future scheduling day will be raised and more rewards can be obtained due to a larger demand response load reduction amount. Based on the above descriptions, the charge and discharge control technology can make full use of the electric energy released from the energy storage on a scheduling day (e.g., the time interval during which the energy storage releases the electric energy falls into both the time interval of peak demand and the scheduling time interval designated by the electric power company). Through the aforesaid operations, the charge and discharge control technology can enable the energy storage to provide multiple services (i.e., load shifting from peak hours to off-peak hours, peak load shaving, and demand response load reduction) on a scheduling day so that more benefits (i.e., reducing the energy charge, reducing the demand charge, and obtaining reward regarding demand response load reduction) can be obtained by customers and load of the power supply systems of the electric power companies within the time intervals of peak demand can be reduced significantly.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

FIG. 1I depicts an exemplary example of evaluating a plurality of candidate combinations by a quick searching algorithm.

DETAILED DESCRIPTION

In the following description, the charge and discharge control apparatus and method will be explained with reference to certain example embodiments thereof. However, these example embodiments are not intended to limit the present invention to any specific examples, embodiments, environment, applications, or particular implementations described in these example embodiments. Therefore, descriptions of these example embodiments is only for purpose of illustration rather than to limit the present invention.

It should be appreciated that, in the following embodiments and the attached drawings, elements unrelated to the present invention are omitted from depiction. In addition, dimensions of individual elements and dimensional scales between individual elements in the attached drawings are provided only for illustration, but not to limit the scope of the present invention.

Figure 1A:
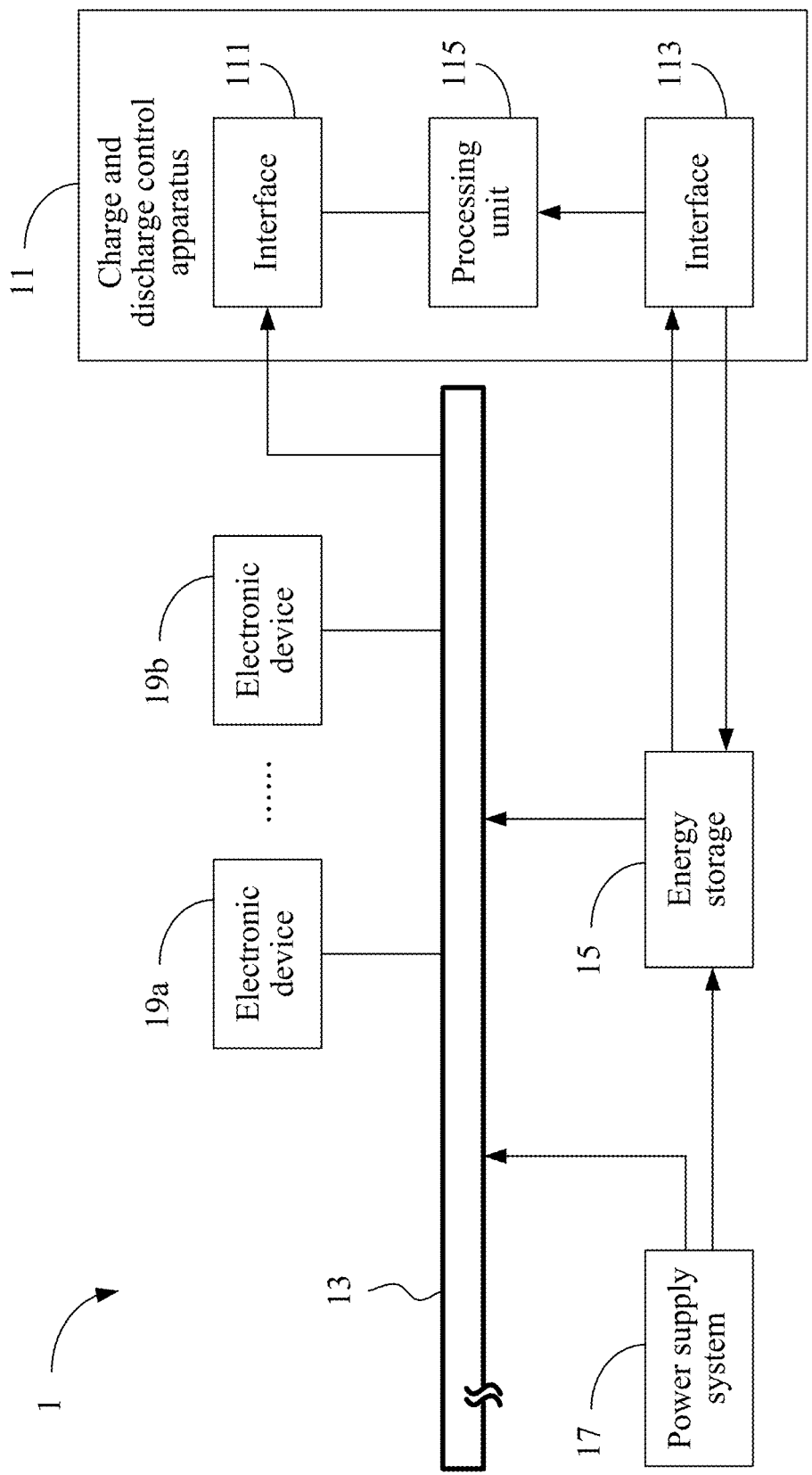
FIG. 1A depicts a schematic view of a power consumption system 1 according to a first embodiment.

A first embodiment of the present invention is a power consumption system 1 and a schematic view of which is depicted in FIG. 1A. The power consumption system 1 comprises a charge and discharge control apparatus 11, an electric circuit 13, an energy storage 15, a power supply system 17 of an electric power company, and a plurality of electronic devices 19a, . . . , 19b. The energy storage 15 may be one of various equipments capable of storing electric energy and capable of charging and discharging. Both the energy storage 15 and the power supply system 17 are connected to the electric circuit 13 and both of them can provide electricity to the electric circuit 13. The energy storage 15 releases electricity to the electric circuit 13 according to discharge time intervals and discharge power values decided by the charge and discharge control apparatus 11, which will be detailed later. The electronic devices 19a, . . . , 19b may be connected to the electric circuit 13 to obtain electricity. It shall be appreciated that the number of electronic devices connected to the electric circuit 13 is not limited to any figure in this embodiment. Moreover, the number of electronic devices connected to the electric circuit 13 may be different at different time points. Although it is shown in FIG. 1A that the electronic devices 19a, . . . , 19b are connected to the electric circuit 13, this is only an example of the operation at a certain time point. Furthermore, the energy storage 15 is connected to the power supply system 17 and is charged by the power supply system 17 according to charge time intervals and charge powers decided by the charge and discharge control apparatus 11, which will be detailed later.

The core of this embodiment is the charge and discharge control apparatus 11. The charge and discharge control apparatus 11 comprises two interfaces 111 and 113 and a processing unit 115. The processing unit 115 is electrically connected to the interfaces 111 and 113, while the interfaces 111 and 113 are electrically connected to the electric circuit 13 and the energy storage 15 respectively. The charge and discharge control apparatus 11 may be one of various apparatuses capable of electronic computation (e.g., various computers and servers). The processing unit 115 may be a central processing unit (CPU), a microprocessor, or other computing element known to those of ordinary skill in the art. The interface 111 may be any interface capable of receiving information from the electric circuit 13 (e.g., an interface that receives information about power consumption related load parameters from a power consumption measuring apparatus (not shown) on the electric circuit 13), while the interface 113 may be any interface capable of exchanging information with the energy storage 15. Please note that the charge and discharge control apparatus 11 may not comprise the interface 113 in some embodiments. In those embodiments, the charge and discharge of the energy storage 15 is not directly controlled by the charge and discharge control apparatus 11, but the energy storage 15 is still charged based on the charge time intervals and the charge powers decided by the charge and discharge control apparatus 11 (e.g., a user directly inputs data calculated by the charge and discharge control apparatus 11 into the energy storage 15) and still discharges based on the discharge time intervals and the discharge power values decided by the charge and discharge control apparatus 11 (e.g., the user directly inputs data calculated by the charge and discharge control apparatus 11 into the energy storage 15).

In this embodiment, the charge and discharge control apparatus 11 categories power supplying days into two types, i.e., scheduling days and normal days. If an electric power company predicts that a certain time interval in a certain day will be a time interval of peak demand and wishes customers to reduce consumed power values within that time interval (e.g., demand response load reduction), the electric power company takes that day as a scheduling day and that time interval of that day as a scheduling time interval. It shall be appreciated that the duration of the scheduling time interval is determined by the electric power company and is not shorter than a minimum load-reduction time interval (e.g., 2 hours). Please note that a day which is not a scheduling day is a normal day. On a scheduling day, the electric power company calculates a customer base line according to maximum consumed power values of the customers within the same time interval (i.e., a time interval corresponding to the scheduling time interval) in past several normal days (e.g., calculates an average of these maximum consumed power values), derives the reduced consumed power (i.e., demand response load reduction amount) by subtracting the consumed power value within the scheduling time interval from the customer base line, and rewards the consumers according to the demand response load reduction amounts (e.g., reward the consumers in money). Within a scheduling time interval of a scheduling day, the larger the demand response load reduction amount is achieved by the customer, the more rewards the consumer will obtain.

In this embodiment, the charge and discharge control apparatus 11 sets the same adjustment time interval for each of the power supplying days (including normal days and scheduling days). The range of the adjustment time interval covers the scheduling time interval that may be decided by the electric power company in any scheduling day. For example, the scheduling time interval decided by the electric power company is generally the time interval where the power consumption peak is predicted to happen, so the charge and discharge control apparatus 11 may select the union of the time intervals of peak demand of the electric power company as the adjustment time interval (e.g., from 10:00 am to 5:00 pm) according to the historic power supply data of the electric power company.

Hereinafter, the operation of the charge and discharge control apparatus 11 on a normal day will be described, and then the operation of the charge and discharge control apparatus 11 on a scheduling day will be described.

On a normal day, the processing unit 115 of the charge and discharge control apparatus 11 decides in which time intervals within the adjustment time interval the energy storage 15 charges and in which time intervals within the adjustment time interval the energy storage 15 discharges according to a predicted load curve of the electric circuit 13 of the normal day. Those of ordinary skill in the art shall appreciate that the predicted load curve comprises a plurality of predicted power demand values corresponding to a plurality of time intervals respectively. For the adjustment time interval of a normal day, if the predicted power demand value of a certain time interval is relatively high (i.e., higher than a peak shaving threshold, which will be detailed later), the processing unit 115 will arrange the energy storage 15 to discharge power within that time interval to reduce the actual consumed power within that time interval and, thereby, reducing the demand charge to be paid by the consumer. Besides, for the adjustment time interval of a normal day, if the predicted power demand value of a certain time interval is relatively low (i.e., lower than a customer base line, which will be detailed later), the processing unit 115 will arrange the energy storage 15 to be charged within that time interval to increase the actual consumed power of that time interval and, thereby, raise the customer base line used in a future scheduling day and more rewards can be obtained due to a larger demand response load reduction amount. Because the charge and discharge control apparatus 11 utilizes both the peak shaving threshold and the customer base line on a normal day to control charge and discharge of the energy storage 15 within the adjustment time interval, load shifting from peak hours to off-peak hours can also be achieved and leading to the reduction of the energy charge of the customer.

Figure 1B:
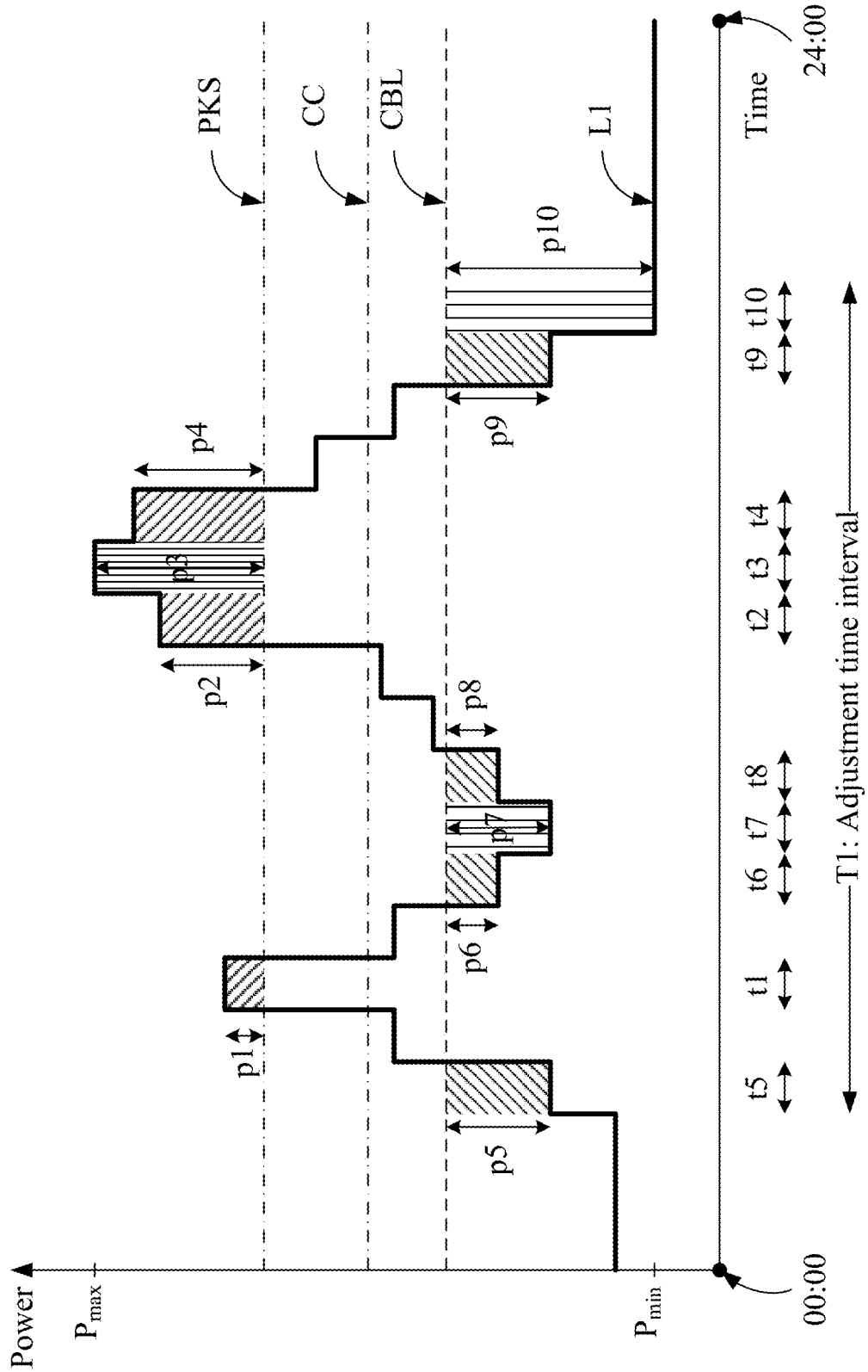
FIG. 1B depicts a specific example regarding the charge and discharge control apparatus 11 managing the charge and discharge of an energy storage 15 on a normal day.

For ease of understanding, how the charge and discharge control apparatus 11 manages the charge and discharge of the energy storage 15 within the adjustment time interval T1 of a normal day will be detailed hereinafter by taking FIG. 1B as an example. The processing unit 115 of the charge and discharge control apparatus 11 calculates a predicted load curve L1 of the electric circuit 13 of a normal day before the arrival of the normal day (e.g., calculates the predicted load curve L1 according to the historic power consumption records of the electric circuit 13). It shall be appreciated that how the processing unit 15 calculates the predicted load curve L1 of the electric circuit 13 is not the focus of the present invention and thus will not be further described herein.

In this embodiment, the processing unit 115 decides a peak shaving threshold PKS between a contracted capacity CC (which is agreed between the customer of the electric circuit 13 and the electric power company) and a peak $P_{max}$ of the predicted load curve of the electric circuit 13 in the adjustment time interval T1 (i.e., a part of the predicted load curve L1 that corresponds to the adjustment time interval T1), wherein a difference between the peak $P_{max}$ and the peak shaving threshold PKS is not greater than a maximum discharge power of the energy storage 15. The processing unit 115 decides a plurality of discharge time intervals t1, t2, t3, and t4 of the energy storage 15 and a plurality of discharge power values p1, p2, p3, and p4 respectively corresponding to the discharge time intervals t1, t2, t3 and t4 according to the peak shaving threshold PKS and the predicted load curve of the electric circuit 13 in the adjustment time interval T1 (i.e., the part of the predicted load curve L1 corresponding to the adjustment time interval T1). It shall be appreciated that the discharge power value corresponding to a discharge time interval is the predicted power demand value corresponding to the discharge time interval minus the peak shaving threshold PKS.

In other words, the processing unit 115 determines that the predicted power demand values (which are recorded in the predicted load curve L1) corresponding to the discharge time intervals t1, t2, t3, and t4 are higher than the peak shaving threshold PKS (i.e., the predicted power demand values are relatively high), so the processing unit 115 arranges the energy storage 15 to discharge power at the discharge power values p1, p2, p3, and p4 respectively in the discharge time interval t1, t2, t3, and t4. In this way, the demand charge to be paid by the customer is reduced because the actual consumed power of the electric circuit 13 to the power supply system 17 in the discharge time intervals t1, t2, t3 and t4 is reduced.

Additionally, the processing unit 115 decides a customer base line CBL between the contracted capacity CC and a valley value $P_{min}$ of the predicted load curve of the electric circuit 13 in the adjustment time interval T1 (i.e., a part of the predicted load curve L1 that corresponds to the adjustment time interval T1), wherein a difference between the customer base line CBL and the valley value $P_{min}$ is not greater than a maximum charge power of the energy storage 15. The processing unit 115 decides a plurality of charge time intervals t5, t6, t7, t8, t9, and t10 of the energy storage 15 and a plurality of charge power values p5, p6, p7, p8, p9, and p10 respectively corresponding to the charge time intervals t5, t6, t7, t8, t9, and t10 according to the customer base line CBL and the predicted load curve of the electric circuit 13 in the adjustment time interval T1 (i.e., the part of the predicted load curve L1 that corresponds to the adjustment time interval T1). It shall be appreciated that the charge power value corresponding to a charge time interval is the customer base line CBL minus the predicted power demand value corresponding to the charge time interval.

In other words, the processing unit 115 determines that the predicted power demand values (which are recorded in the predicted load curve L1) corresponding to the charge time intervals t5, t6, t7, t8, t9, and t10 are lower than the customer base line CBL (i.e., the predicted power demand values are relatively low), so the processing unit 115 arranges the energy storage 15 to be charged at the charge power values p5, p6, p7, p8, p9, and p10 respectively in the charge time interval t5, t6, t7, t8, t9, and t10. In this way, the customer base line to be calculated in a further scheduling day will be raised because the actual consumed power of the electric circuit 13 to the power supply system 17 in the charge time intervals t5, t6, t7, t8, t9 and t10 is increased.

In this embodiment, the processing unit 115 calculates a predicted load curve of the electric circuit 13 periodically (e.g., every 15 minutes, or longer or shorter than 15 minutes) in the remaining time of the normal day (e.g., before the end of the charge time interval t5, calculates a predicted load curve of the electric circuit 13 corresponding to the remaining time starting from the end of the charge time interval t5), and then adjusts the charge time interval(s), the charge power value(s), the discharge time interval(s), and the discharge power value(s) of the energy storage 15 in the remaining time interval of the adjustment time interval T1 according to the newly calculated predicted load curve. How the processing unit 115 performs the operations periodically shall be appreciated by those of ordinary skill in the art based on the above descriptions and, thus, will not be further described herein. It shall be appreciated that, in some embodiments, the processing unit 115 may calculate the predicted load curve of a normal day only one time and calculate the charge time intervals, the charge power values, the discharge time intervals, and the discharge power values only one time. In other words, in these embodiments, the processing unit 115 will not periodically adjust the charge time intervals, the charge power values, the discharge time intervals, and the discharge power values of an adjustment time interval of a normal day.

Figure 1C:
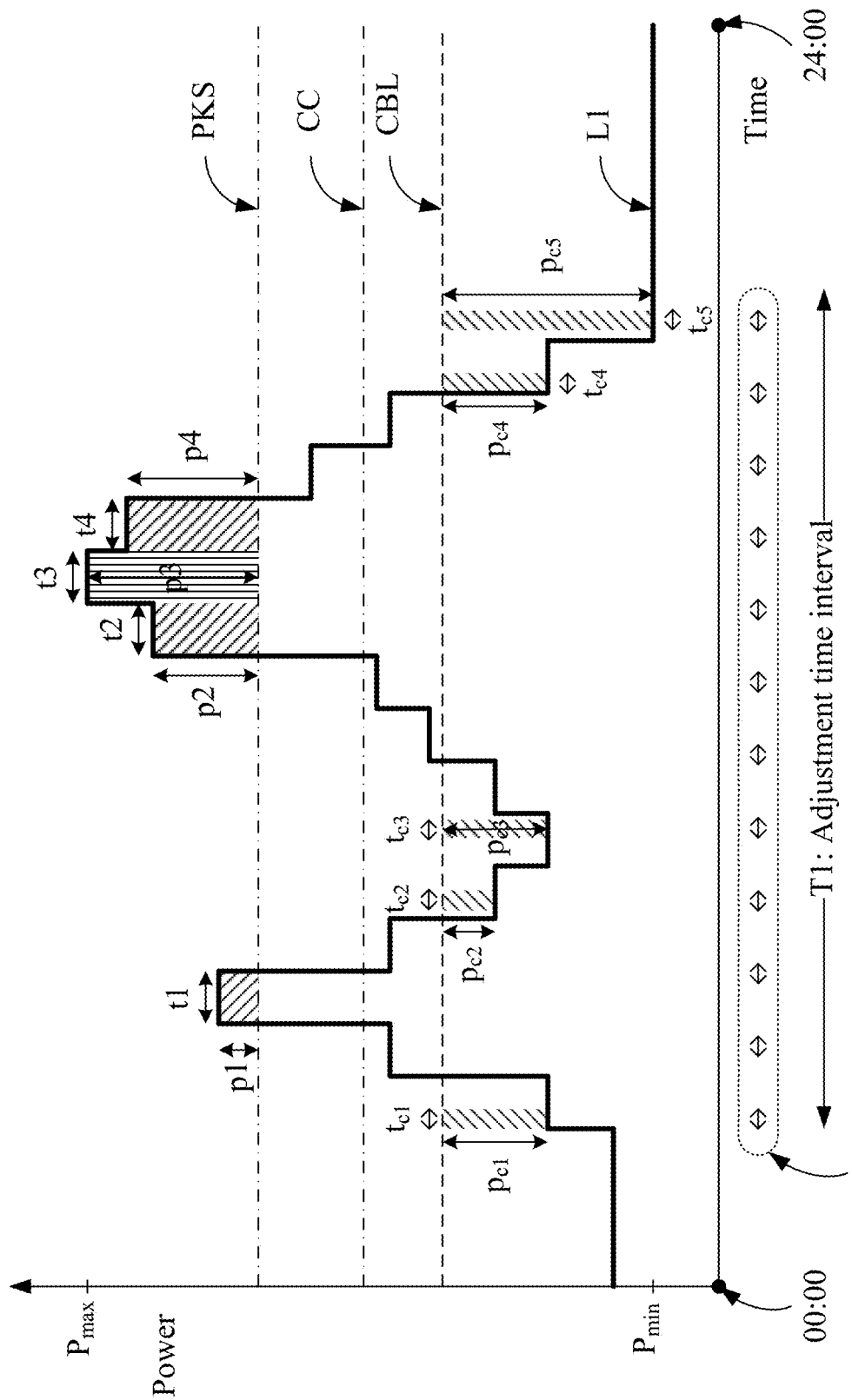
FIG. 1C depicts a specific example where the charge time intervals are arranged in serration form.

In some embodiments, the processing unit 15 may arrange the charge time intervals in the adjustment time interval T1 of the normal day in a serration form. Arranging the charge time intervals in the serration form is based on the considerations that (a) the customer base line of a scheduling day is calculated by the electric power company according to maximum power demand values of the customers within the same time interval (i.e., a time interval corresponding to the scheduling time interval) in past several normal days and (b) the scheduling time interval is not shorter than a minimum load-reduction time interval (e.g., 2 hours). Based on the above considerations, the processing unit 115 may define a plurality of preset charge time intervals within the adjustment time interval T1, wherein the duration of each of the preset charge time intervals is the minimum demand calculation unit (e.g., 15 minutes), the preset charge time intervals are arranged alternately with a plurality of non-charge time intervals (i.e., the preset charge time intervals are not adjacent to each other), and an interval between each preset charge time interval and a next preset charge time interval is shorter than the minimum load-reduction time interval (i.e., there will be a preset charge time interval in any minimum load-reduction time interval) as shown in FIG. 1C.

In those embodiments, the processing unit 115 determines whether the predicted power demand values corresponding to the preset charge time intervals are smaller than the customer base line CBL. If the predicted power demand value corresponding to a preset charge time interval is smaller than the customer base line CBL, the processing unit 115 takes the preset charge time interval as a charge time interval. In the specific example shown in FIG. 1C, the processing unit 115 decides the charge time intervals $t_{c1}$, $t_{c2}$, $t_{c3}$, $t_{c4}$, and $t_{c5}$ from the preset charge time intervals and decides the charge power values $p_{c1}$, $p_{c2}$, $p_{c3}$, $p_{c4}$, and $p_{c5}$ respectively corresponding to the charge time intervals $t_{c1}$, $t_{c2}$, $t_{c3}$, $t_{c4}$ and $t_{c5}$.

When the processing unit 115 arranges the charge time intervals in the adjustment time interval T1 of the normal day in a serration form, the actual consumed power of the electric circuit 13 to the power supply system 17 in the charge time intervals can be increased at a lower cost and, thereby, raising the customer base line to be calculated in a further scheduling day.

Figure 1D:
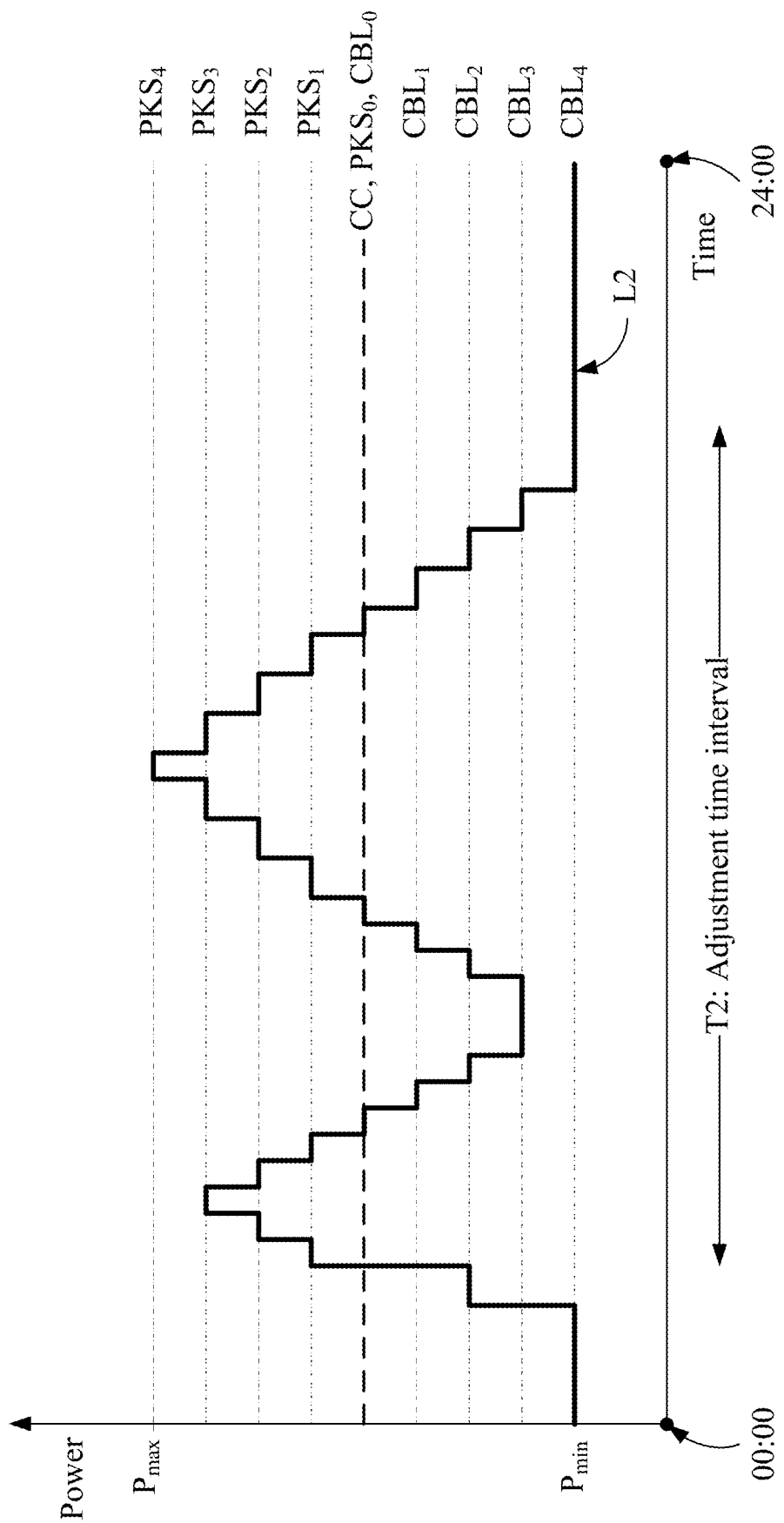
FIG. 1D depicts a plurality of preset peak shaving thresholds and a plurality of preset customer base lines decided in a specific example.

In some embodiments, the processing unit 115 decides the peak shaving threshold PKS from a plurality of preset peak shaving thresholds and decides the customer base line CBL from a plurality of preset customer base lines. For ease of understanding, the details will be described with reference to the predicted load curve L2 and the adjustment time interval T2 of the normal day shown in FIG. 1D. Please note that the specific example shown in FIG. 1D is not intended to limit the scope of the present invention.

In those embodiments, the processing unit 115 decides a plurality of preset peak shaving thresholds $PKS_0$, $PKS_1$, $PKS_2$, $PKS_3$, and $PKS_4$ between the contracted capacity CC and a peak $P_{max}$ of the predicted load curve of the electric circuit 13 in the adjustment time interval T2 (i.e., a part of the predicted load curve L2 that corresponds to the adjustment time interval T2), wherein a difference between the peak $P_{max}$ and each of the preset peak shaving thresholds $PKS_0$, $PKS_1$, $PKS_2$, $PKS_3$, and $PKS_4$ is not greater than the maximum discharge power of the energy storage 15. Moreover, the processing unit 115 decides a plurality of preset customer base lines $CBL_0$, $CBL_1$, $CBL_2$, $CBL_3$, and $CBL_4$ between the contracted capacity CC and a valley value $P_{min}$ of the predicted load curve of the electric circuit 13 in the adjustment time interval T2 (i.e., a part of the predicted load curve L2 that corresponds to the adjustment time interval T2), wherein a difference between each of the preset customer base lines $CBL_0$, $CBL_1$, $CBL_2$, $CBL_3$ and $CBL_4$ and the valley value $P_{min}$ is not greater than the maximum charge power of the energy storage 15.

Next, the processing unit 115 decides a plurality of candidate combinations, wherein each of the candidate combinations comprises a candidate peak shaving threshold and a candidate customer base line. The candidate peak shaving threshold of each of the candidate combinations is one of the preset peak shaving thresholds $PKS_0$, $PKS_1$, $PKS_2$, $PKS_3$, and $PKS_4$, while the candidate customer base line of each of the candidate combinations is one of the preset customer base lines $CBL_0$, $CBL_1$, $CBL_2$, $CBL_3$, and $CBL_4$. In the specific example shown in FIG. 1D, there are five preset peak shaving thresholds and five preset customer base lines, so the processing unit 115 can decide 25 candidate combinations at most. It shall be appreciated that the number of the candidate combinations decided by the processing unit 115 is not restricted in the present invention.

The processing unit 115 performs the following operations for each of the candidate combinations: (a) deciding a plurality of candidate discharge time intervals of the energy storage 15, a candidate discharge power value, of each of the candidate discharge time intervals, a plurality of candidate charge time intervals of the energy storage 15, and a candidate charge power value of each of the candidate charge time intervals according to the predicted load curve L2, the candidate peak shaving threshold of the candidate combination, and the candidate customer base line of the candidate combination and (b) calculating an estimated energy storage amount of the energy storage 15 at each of a plurality of time points according to an estimated initial energy storage amount of the energy storage 15, the candidate discharge power values, and the candidate charge power values. Furthermore, when the processing unit 115 performs the aforesaid operation (a) for each of the candidate combinations, the processing unit 115 may decide a plurality of candidate discharge time intervals of the energy storage 15 and a candidate discharge power value of each of the candidate discharge time intervals according to the predicted load curve L2 and the candidate peak shaving threshold of the candidate combination and may decide a plurality of candidate charge time intervals of the energy storage 15 and a candidate charge power value of each of the candidate charge time intervals according to the predicted load curve L2 and the candidate customer base line of the candidate combination.

For ease of understanding, it is assumed that the processing unit 115 has decided four candidate combinations, wherein the first candidate combination comprises the preset peak shaving threshold $PKS_0$ and the preset customer base line $CBL_0$, the second candidate combination comprises the preset peak shaving threshold $PKS_1$ and the preset customer base line $CBL_1$, the third candidate combination comprises the preset peak shaving threshold $PKS_1$ and the preset customer base line $CBL_2$, and the fourth candidate combination comprises the preset peak shaving threshold $PKS_2$ and the preset customer base line $CBL_3$. Next, the processing unit 115 performs the aforesaid operations (a) and (b) for each of the first candidate combination, the second candidate combination, the third candidate combination, and the fourth candidate combination.

Figure 1E:
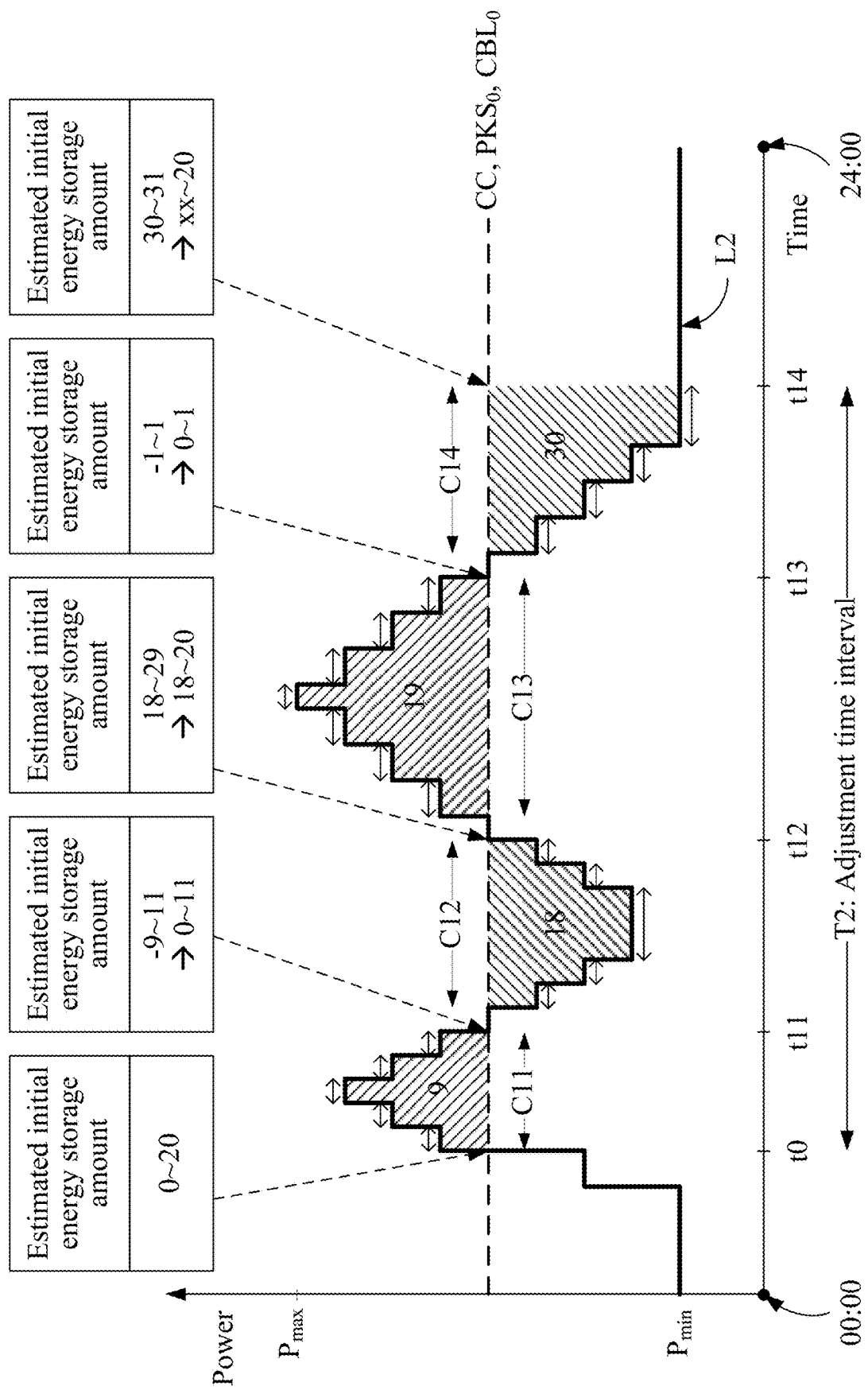
FIG. 1E depicts evaluation made by the charge and discharge control apparatus 11 on a first candidate combination.

Please refer to FIG. 1E, which is a schematic view depicting the aforesaid operations (a) and (b) performed by the processing unit 115 for the first candidate combination. The processing unit 115 decides a plurality of candidate discharge time intervals of the energy storage 15, a candidate discharge power value of each of the candidate discharge time intervals, a plurality of candidate charge time intervals of the energy storage 15, and a candidate charge power value of each of the candidate charge time intervals according to the predicted load curve L2 and the preset peak shaving threshold $PKS_0$ and the preset customer base line $CBL_0$ comprised in the first candidate combination. More particularly, the processing unit 115 decides the candidate discharge time intervals of the energy storage 15 and the candidate discharge power value of each of the candidate discharge time intervals according to the predicted load curve L2 and the preset peak shaving threshold $PKS_0$. As shown in FIG. 1E, five candidate discharge time intervals decided by the processing unit 115 are comprised within a time interval C11 and another seven candidate discharge time intervals decided by the processing unit 115 are comprised within a time interval C13. Moreover, the processing unit 115 decides the candidate charge time intervals of the energy storage 15 and the candidate charge power value of each of the candidate charge time intervals according to the predicted load curve L2 and the preset customer base line $CBL_0$. As shown in FIG. 1E, five candidate charge time intervals decided by the processing unit 115 are comprised within a time interval C12 and another four candidate charge time intervals decided by the processing unit 115 are comprised within a time interval C14.

If arranging the energy storage 15 to shave the peak (i.e., reduce the actual consumed power of the electric circuit 13 to the power supply system 17) with the preset peak shaving threshold $PKS_0$, the power amounts that can be reduced (i.e., the discharge amounts of the energy storage 15) after the time intervals C11 and C13 may be respectively represented by the areas formed by parts of the predicted load curve L2 that correspond to the time intervals C11 and C13 together with the preset peak shaving threshold $PKS_0$. Similarly, if arranging the energy storage 15 to raise the valley (i.e., increase the actual consumed power of the electric circuit 13 to the power supply system 17) with the preset customer base line $CBL_0$, the power amounts that can be increased (i.e., the charge amounts of the energy storage 15) after the time intervals C12 and C14 may be respectively represented by the areas formed by parts of the predicted load curve L2 that correspond to the time intervals C12 and C14 together with the preset customer base line $CBL_0$.

The processing unit 115 calculates an estimated energy storage amount of the energy storage 15 at each of a plurality of time points t11, t12, t13, and t14 according to an estimated initial energy storage amount of the energy storage 15, the candidate discharge power values, and the candidate charge power values. It shall be appreciated that each of the time points t11, t12, t13 and t14 corresponds to a time point where one of the charge time intervals and the discharge time intervals ends. In addition, each of the estimated initial energy storage amount and the estimated energy storage amounts described above may be a range or may be a value.

It is assumed that an energy storage amount range of the energy storage 15 is from 0 kWh to 20 kWh, an estimated initial energy storage amount of the energy storage 15 at the time point t0 is 0 to 20 kWh, the reduced power amounts corresponding to the time intervals C11 and C13 are 9 kWh and 19 kWh respectively, and the increased power amounts corresponding to the time intervals C12 and C14 are 18 kWh and 30 kWh respectively. The processing unit 115 calculates the estimated energy storage amount corresponding to the time point t11 (i.e., −9 kWh to 11 kWh) according to the estimated initial energy storage amount at the time point t0 (i.e., 0 to 20 kWh) and the reduced power amount corresponding to the time interval C11 (i.e., 9 kWh) and then corrects the estimated energy storage amount corresponding to the time point t11 according to the energy storage amount range of the energy storage 15 (i.e., takes the overlap between the estimated energy storage amount and the energy storage amount range as the corrected estimated energy storage amount, which is 0 to 11 kWh). Next, the processing unit 115 calculates the estimated energy storage amount corresponding to the time point t12 (i.e., 18 kWh to 29 kWh) according to the estimated energy storage amount at the time point t1 (i.e., 0 to 11 kWh) and the increased power amount corresponding to the time interval C12 (i.e., 18 kWh) and then corrects the estimated energy storage amount corresponding to the time point t12 according to the energy storage amount range of the energy storage 15 (i.e., takes the overlap between the estimated energy storage amount and the energy storage amount range as the corrected estimated energy storage amount, which is 18 kWh to 20 kWh). Similarly, the processing unit 115 calculates and corrects the estimated energy storage amount corresponding to each of the time points t13 and t14. The estimated energy storage amount calculated by the processing unit 115 for the time point t14 is 30 kWh to 31 kWh. Since there is no overlap between this estimated energy storage amount and the energy storage amount range of the energy storage 15, the processing unit 115 cannot correct this estimated energy storage amount into the energy storage amount range of the energy storage 15.

Figure 1F:
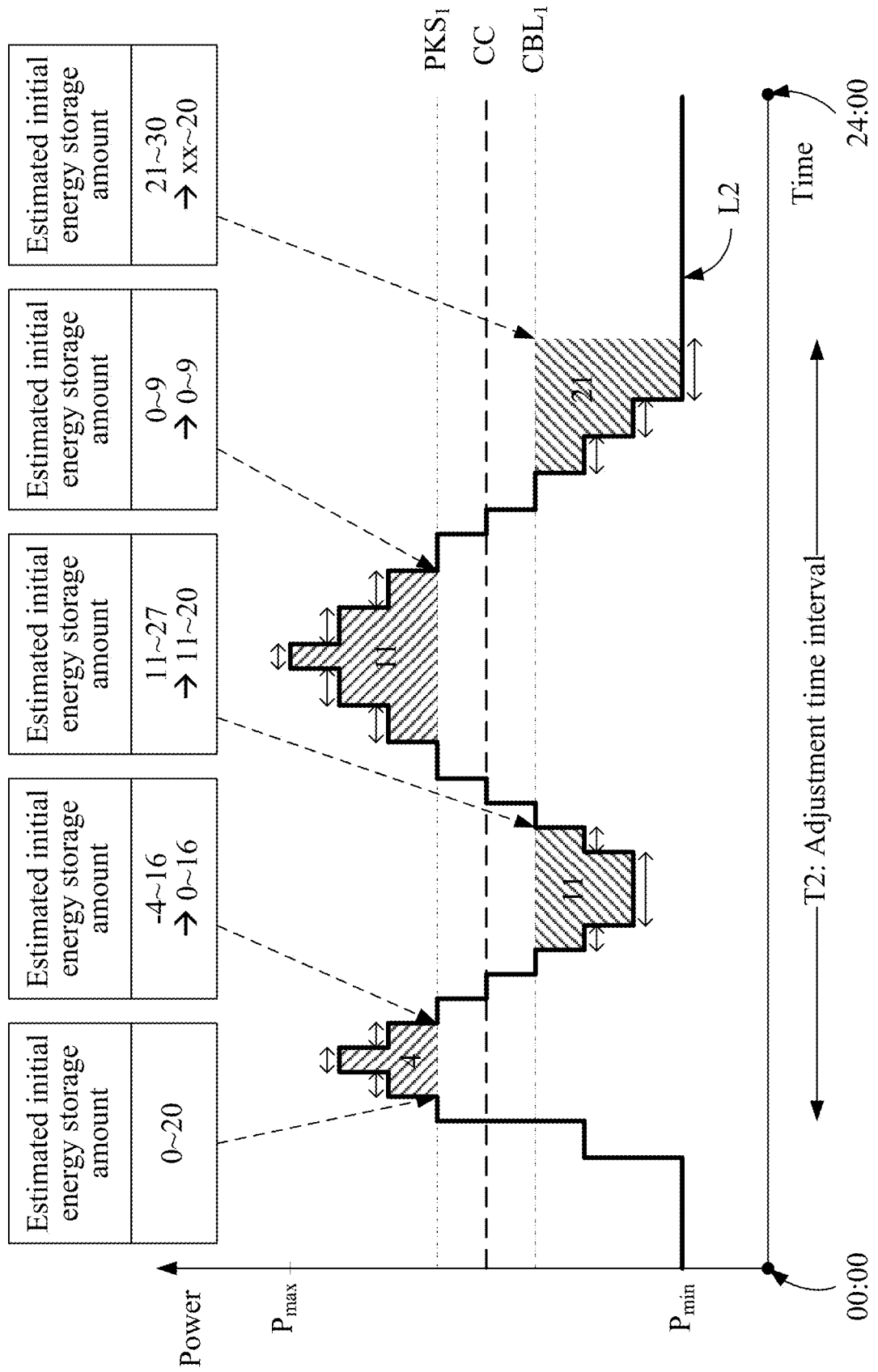
FIG. 1F depicts evaluation made by the charge and discharge control apparatus 11 on a second candidate combination.
Figure 1G:
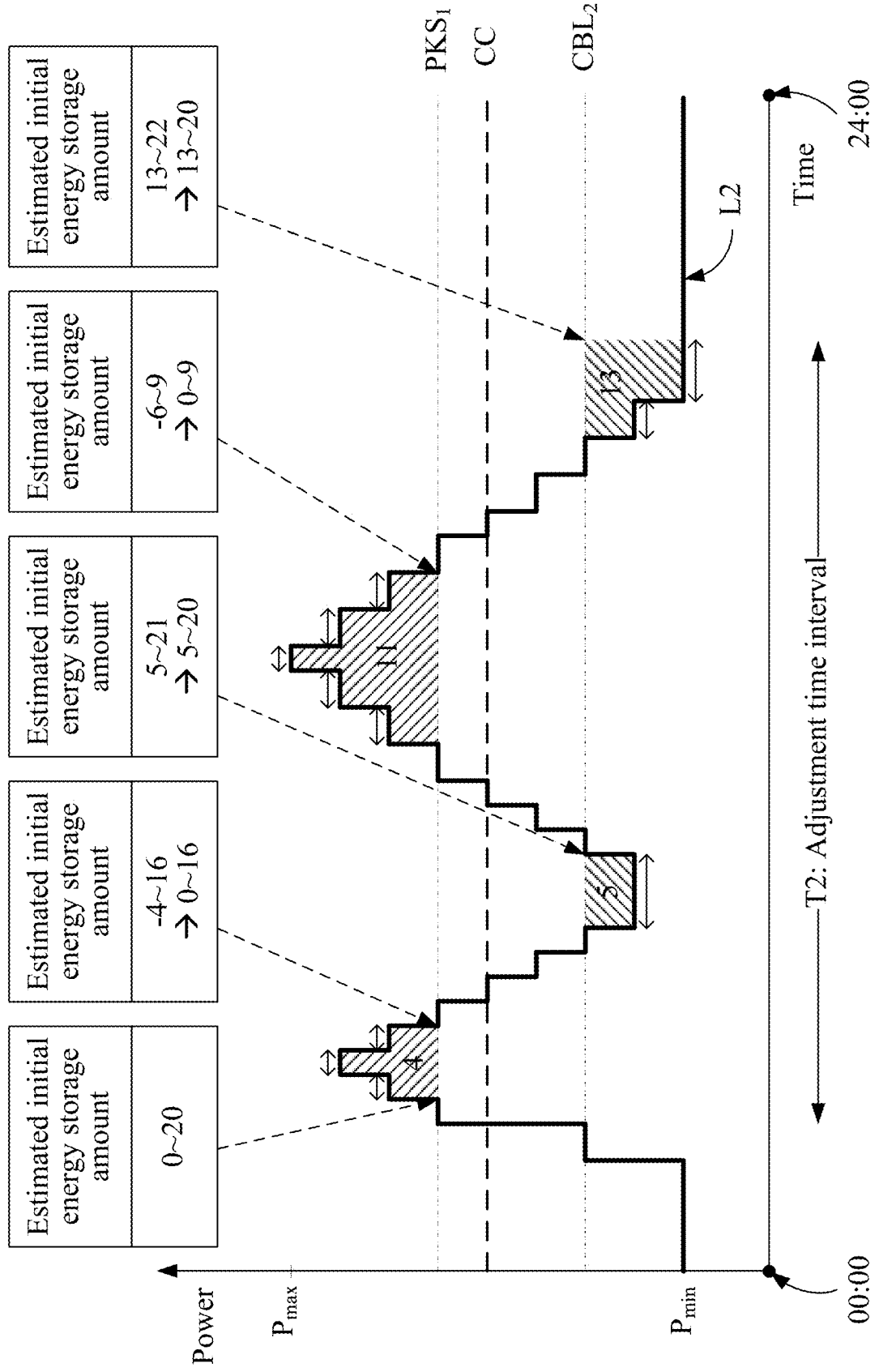
FIG. 1G depicts evaluation made by the charge and discharge control apparatus 11 on a third candidate combination.
Figure 1H:
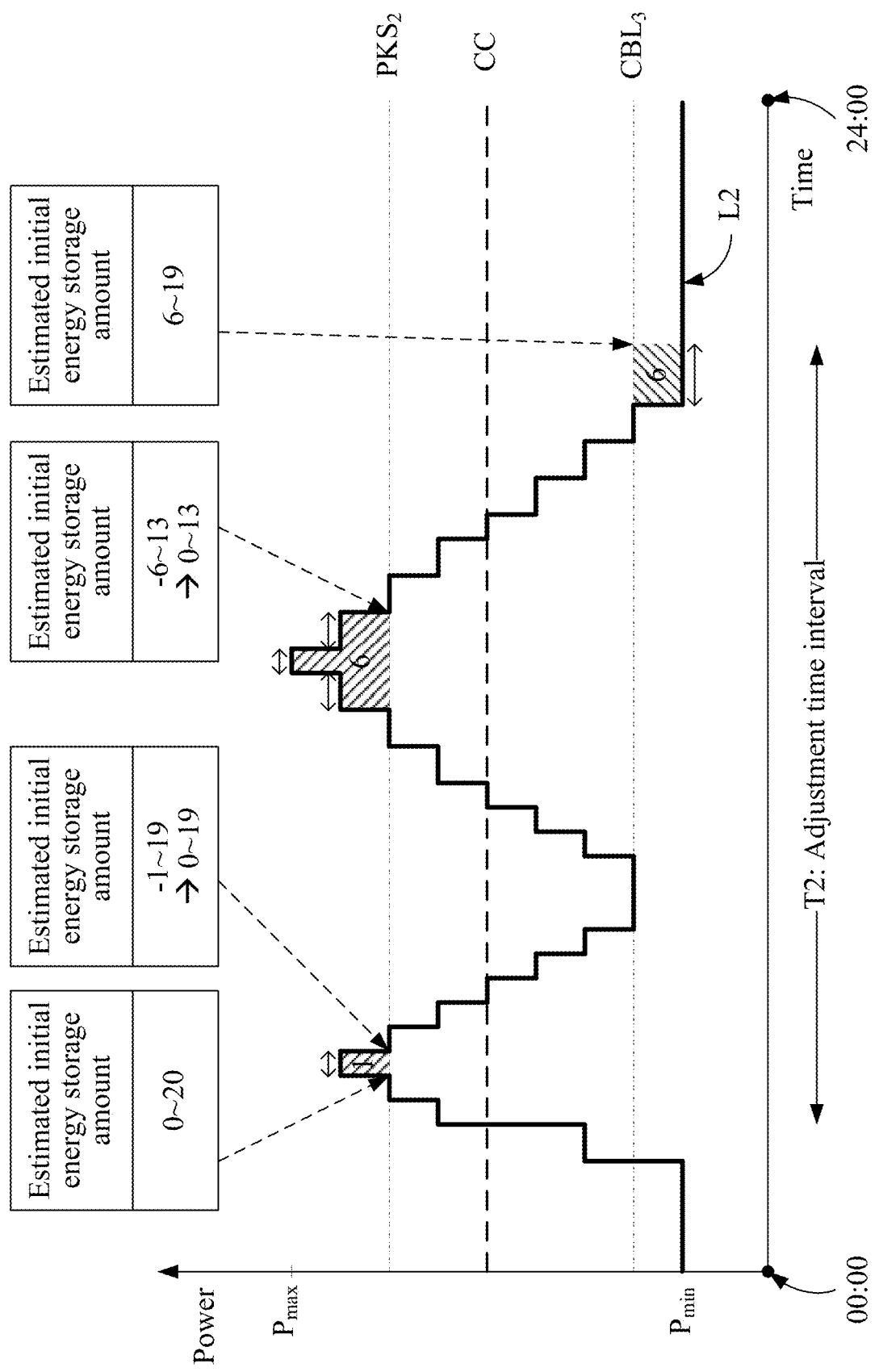
FIG. 1H depicts evaluation made by the charge and discharge control apparatus 11 on a fourth candidate combination.

Please refer to FIG. 1F, FIG. 1G, and FIG. 1H, which are schematic views depicting the aforesaid operations (a) and (b) performed by the processing unit 115 for the second candidate combination, the third candidate combination, and the fourth candidate combination. How the processing unit 115 calculates the estimated energy storage amounts as shown in FIG. 1F, FIG. 1G, and FIG. 1H shall be appreciated by those of ordinary skill in the art based on the aforesaid description, and thus will not be further described herein.

The processing unit 115 decides a subset of the candidate combinations according to the energy storage amount range of the energy storage 15 and the estimated energy storage amounts of each of the candidate combinations. Specifically, if all the estimated energy storage amounts corresponding to a candidate combination can be corrected into the energy storage amount range, that candidate combination will be selected into the subset. In other words, any candidate combination comprised in the subset is a qualified combination. The processing unit 115 selects the candidate peak shaving threshold and the candidate customer base line of one candidate combination from the subset as the peak shaving threshold PKS and the customer base line CBL used in the adjustment time interval of the normal day respectively. For the aforesaid example, the subset decided by the processing unit 115 comprises the third candidate combination and the fourth candidate combination, so the candidate peak shaving threshold and the candidate customer base line comprised in any of the third candidate combination and the fourth candidate combination may serve as the peak shaving threshold PKS and the customer base line CBL used in the adjustment time interval of the normal day respectively.

In some embodiments, the processing unit 115 further performs other evaluations after deciding the subset, decides which candidate combination in the subset is to be selected according to the evaluations, and adopts the candidate peak shaving threshold and the candidate customer base line comprised in the selected candidate combination as the peak shaving threshold PKS and the customer base line CBL used in the adjustment time interval of the normal day. Specifically, the processing unit 115 performs the following operations for each of the candidate combinations comprised in the subset: (c) deciding a load adjustment curve of the candidate combination according to the predicted load curve L2 and the candidate discharge time intervals, the candidate discharge power values, the candidate charge time intervals, and the candidate charge power values of the candidate combination and (d) calculating an adjustment benefit amount of the candidate combination according to the predicted load curve L2 and the load adjustment curve. The adjustment benefit amount may be relevant to an electric charge reduced amount, a demand rewards, and/or an operation cost of the energy storage. Thereafter, the processing unit 115 selects the candidate peak shaving threshold and the candidate customer base line corresponding to the candidate combination that has the greatest adjustment benefit amount as the peak shaving threshold PKS and the customer base line CBL used in the adjustment time interval of the normal day respectively.

In some embodiments, the processing unit 115 may adopt a quick searching algorithm to decide the peak shaving threshold PKS and the customer base line CBL used in the adjustment time interval of the normal day. The quick searching algorithm may considers the preset customer base lines $CBL_0$, $CBL_1$, $CBL_2$, $CBL_3$, and $CBL_4$ first or considers the preset peak shaving thresholds $PKS_0$, $PKS_1$, $PKS_2$, $PKS_3$, and $PKS_4$ first. In these embodiments, the preset peak shaving thresholds $PKS_0$, $PKS_1$, $PKS_2$, $PKS_3$, and $PKS_4$ have an ascending order, i.e., from the smallest one to the largest one are the preset peak shaving thresholds $PKS_0$, $PKS_1$, $PKS_2$, $PKS_3$, and $PKS_4$. Moreover, the preset customer base lines $CBL_0$, $CBL_1$, $CBL_2$, $CBL_3$, and $CBL_4$ have a descending order, i.e., from the largest one to the smallest one are the preset customer base lines $CBL_0$, $CBL_1$, $CBL_2$, $CBL_3$, and $CBL_4$.

Herein, the implementation that considers the preset customer base lines $CBL_0$, $CBL_1$, $CBL_2$, $CBL_3$, and $CBL_4$ first will be described. The processing unit 115 selects one of the preset customer base lines as a candidate customer base line according to the descending order. Next, the processing unit 115 performs the following operations for the candidate customer base line: (i) selecting one of the preset peak shaving thresholds $PKS_0$, $PKS_1$, $PKS_2$, $PKS_3$, and $PKS_4$ as a candidate peak shaving threshold according to the ascending order, and taking the candidate peak shaving threshold and the candidate customer base line as a candidate combination, (ii) deciding a plurality of candidate discharge time intervals of the energy storage 15 and a candidate discharge power value of each of the candidate discharge time intervals according to the predicted load curve L2 and the candidate peak shaving threshold of the candidate combination, (iii) deciding a plurality of candidate charge time intervals of the energy storage 15 and a candidate charge power value of each of the candidate charge time intervals according to the predicted load curve L2 and the candidate customer base line of the candidate combination, (iv) calculating an estimated energy storage amount of the energy storage 15 at each of a plurality of time points according to an estimated initial energy storage amount of the energy storage 15, the candidate discharge power values, and the candidate charge power values, (v) determining whether all of the estimated energy storage amounts overlap with an energy storage amount range of the energy storage 15, and (vi) taking the candidate combination as a qualified combination if all of the estimated energy storage amounts overlap with an energy storage amount range of the energy storage 15, or repeating the operations (i) to (vi) if not all of the estimated energy storage amounts overlap with an energy storage amount range of the energy storage 15.

After performing the aforesaid operation (i) to the operation (vi) for the candidate customer base line (may be one or more rounds), the processing unit 115 determines whether the candidate peak shaving threshold corresponding to the qualified combination is the first one among the preset peak shaving thresholds (i.e., whether the candidate peak shaving threshold is the preset peak shaving threshold $PKS_0$). If the candidate peak shaving threshold corresponding to the qualified combination is not the first one among the preset peak shaving thresholds, the processing unit 115 selects the next preset customer base line as a candidate customer base line according to the descending order and performs the operation (i) to the operation (vi) for that candidate customer base line. If the candidate peak shaving threshold corresponding to the qualified combination is the first one among the preset peak shaving thresholds, the processing unit 115 will not select the next preset customer base line.

Thereafter, the processing unit 115 selects the candidate peak shaving threshold and the candidate customer base line of one of the qualified combinations as the peak shaving threshold PKS and the customer base line CBL used in the adjustment time interval of the normal day respectively.

For ease of understanding, please refer to a specific example depicted in FIG. 1I, which, however, is not intended to limit the scope of the present invention. In the specific example, the processing unit 115 first selects the preset customer base line $CBL_0$ for evaluation (called "the first stage" for convenience) according to the descending order. In the first stage, the processing unit 115 selects the preset peak shaving thresholds $PKS_0$, $PKS_1$, $PKS_2$, $PKS_3$, and $PKS_4$ according to the ascending order to form different candidate combinations with the preset customer base line $CBL_0$ for evaluation. In the first stage, all of the candidate combinations are not qualified combinations.

Then, the processing unit 115 selects the next preset customer base line $CBL_1$ for evaluation (called "the second stage" for convenience) according to the descending order. In the second stage, the processing unit 115 also selects the preset peak shaving thresholds according to the ascending order to form different candidate combinations with the preset customer base line $CBL_1$ for evaluation. In the second stage, the candidate combinations formed by the preset customer base line $CBL_1$ and each of the preset peak shaving thresholds $PKS_0$ and $PKS_1$ are not qualified combinations, but the candidate combination formed by the preset customer base line $CBL_1$ and the preset peak shaving threshold $PKS_2$ is a qualified combination $S_1$. Because the qualified combination $S_1$ has been generated in the second stage, the processing unit 115 will not further evaluation the combinations of the preset customer base line $CBL_1$ and each of the preset peak shaving thresholds $PKS_3$ and $PKS_4$. This is because no more charge amount will be reduced.

Since the preset peak shaving threshold $PKS_2$ corresponding to the qualified combination $S_1$ is not the first one among the preset peak shaving thresholds $PKS_0$, $PKS_1$, $PKS_2$, $PKS_3$, and $PKS_4$, the processing unit 115 selects the next preset customer base line $CBL_2$ for evaluation (called "the third stage" for convenience) according to the descending order. In the third stage, the processing unit 115 performs evaluation based on the same logic and derives a qualified combination $S_2$, wherein the qualified combination $S_2$ corresponds to the preset customer base line $CBL_2$ and the preset peak shaving threshold $PKS_1$. Likewise, since the preset peak shaving threshold $PKS_1$ corresponding to the qualified combination $S_2$ is not the first one among the preset peak shaving thresholds $PKS_0$, $PKS_1$, $PKS_2$, $PKS_3$, and $PKS_4$, the processing unit 115 selects the next preset customer base line $CBL_3$ for evaluation (called "the fourth stage" for convenience) according to the descending order. In the fourth stage, the processing unit 115 performs evaluation based on the same logic and derives a qualified combination $S_3$, wherein the qualified combination $S_3$ corresponds to the preset customer base line $CBL_3$ and the preset peak shaving threshold $PKS_0$. Since the preset peak shaving threshold $PKS_0$ corresponding to the qualified combination $S_3$ is the first one among the preset peak shaving thresholds $PKS_0$, $PKS_1$, $PKS_2$, $PKS_3$, and $PKS_4$, the processing unit 115 will not select the rest preset customer base lines (i.e., the preset customer base line $CBL_4$) for evaluation in other stage. This is because the consumed power value cannot be further increased by adopting the rest preset customer base lines.

Thereafter, the processing unit 115 selects the candidate peak shaving threshold and the candidate customer base line of one of the qualified combinations $S_1$, $S_2$, and $S_3$ as the peak shaving threshold PKS and the customer base line CBL used in the adjustment time interval of the normal day respectively. For example, for each of the qualified combinations $S_1$, $S_2$, and $S_3$, the processing unit 115 may decide a load adjustment curve according to the candidate peak shaving threshold and the candidate customer base line comprised therein and then calculates an adjustment benefit amount according to the predicted load curve L2 and the load adjustment curve. The adjustment benefit amount may be relevant to an electric charge reduced amount, a demand rewards, and/or an operation cost of the energy storage.

Thereafter, the processing unit 115 may select the candidate peak shaving threshold and the candidate customer base line comprised in the qualified combination that corresponds to the greatest adjustment benefit amount as the peak shaving threshold PKS and the customer base line CBL used in the adjustment time interval of the normal day respectively.

Please note that the above descriptions regarding the decision of the peak shaving threshold PKS and the customer base line CBL used in the adjustment time interval of the normal day by a quick searching algorithm is based on the implementation where the preset customer base lines $CBL_0$, $CBL_1$, $CBL_2$, $CBL_3$ and $CBL_4$ are considered first. Based on the above descriptions, those of ordinary skill in the art shall appreciate how to decide the peak shaving threshold PKS and the customer base line CBL used in the adjustment time interval of the normal day by the quick searching algorithm if the preset peak shaving thresholds $PKS_0$, $PKS_1$, $PKS_2$, $PKS_3$ and $PKS_4$ are considered first and, thus, the details will not be further described herein.

Figure 1J:
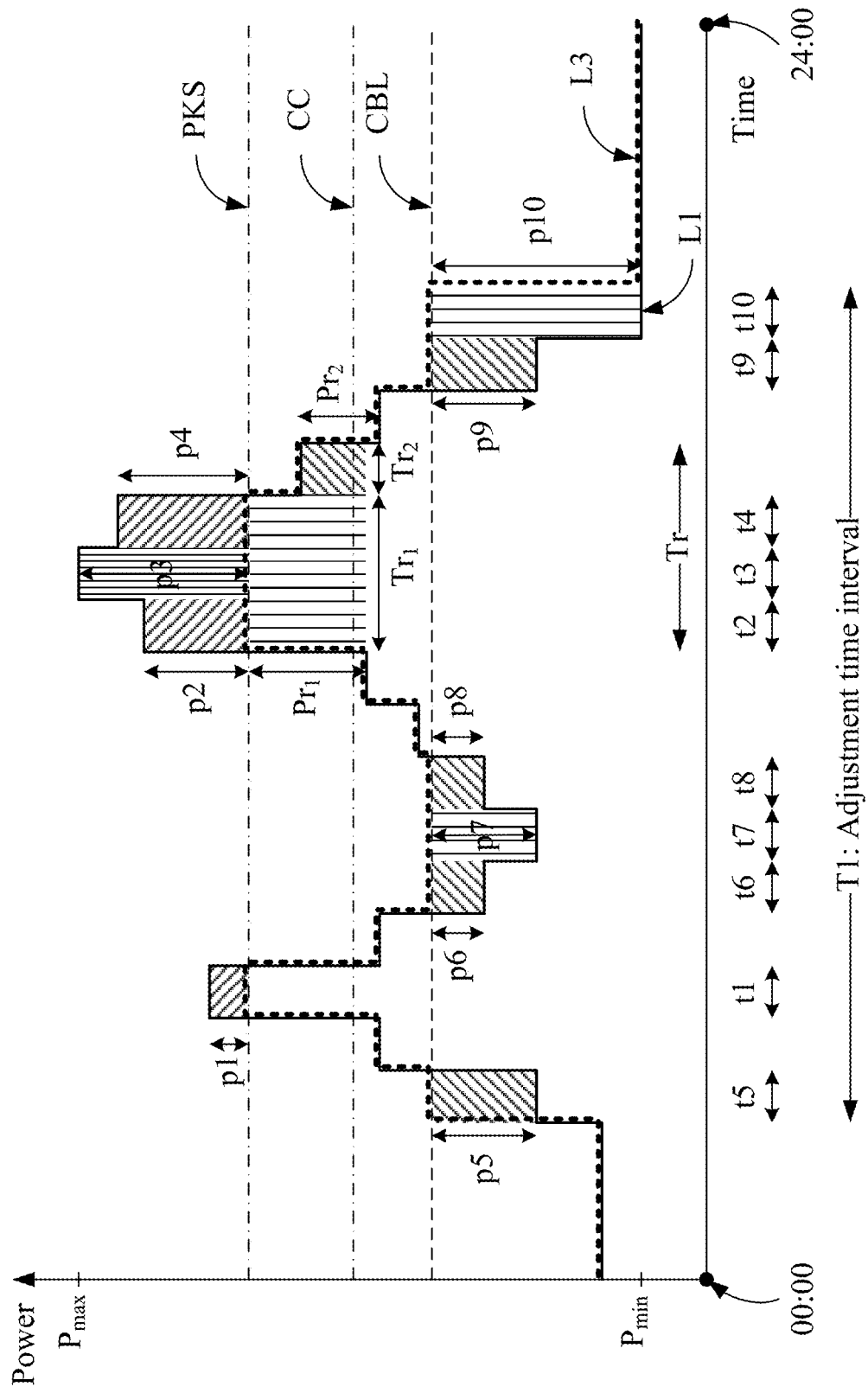
FIG. 1J depicts an exemplary example of a residual energy release mechanism performed by the charge and discharge control apparatus 11 on a normal day.

In some embodiments, the processing unit 115 may further adopt a residual energy release mechanism on a normal day. For ease of understanding, please refer to a specific example depicted in FIG. 1J, which, however, is not intended to limit the scope of the present invention.

In these embodiments, the processing unit 115 decides an adjusted predicted load curve L2' according to the discharge time intervals t1, t2, t3, t4, the discharge power values p1, p2, p3, p4, the charge time intervals t5, t6, t7, t8, t9, t10, the charge powers p5, p6, p7, p8, p9, p10, and the predicted load curve L1, wherein the adjusted predicted load curve L2' comprises a plurality of adjusted power values. The processing unit 115 determines whether a residual energy storage amount of the energy storage 15 at the end of the adjustment time interval T1 is zero. If the residual energy storage amount of the energy storage 15 at the end of the adjustment time interval T1 is not zero, the processing unit 115 decides a residual energy release time interval Tr in the adjustment time interval T1, wherein the adjusted power values corresponding to the residual energy release time interval Tr are greater than the customer base line CBL. The processing unit 115 decides a plurality of residual energy release sub-time intervals $Tr_1$ and $Tr_2$ in the residual energy release time interval Tr and residual energy release power values $Pr_1$ and $Pr_2$ respectively corresponding to the residual energy release sub-time intervals $Tr_1$ and $Tr_2$ according to the residual energy storage amount, the adjusted power values corresponding to the residual energy release time interval Tr, and the customer base line CBL. Please note that the adjusted power value of the adjusted predicted load curve L2' that corresponds to the residual energy release sub-time interval $Tr_1$ minus the residual energy release power value $Pr_1$ cannot be less than the customer base line CBL, and the adjusted power value of the adjusted predicted load curve L2' that corresponds to the residual energy release sub-time interval $Tr_2$ minus the residual energy release power values $Pr_2$ cannot be lower than the customer base line CBL.

The residual energy storage amount of the energy storage 15 can be utilized fully by adopting the residual energy release mechanism. The residual energy storage amount is utilized to reduce the predicated power values in time intervals, which are still relatively high, in the adjustment time interval T1 as much as possible and, thereby, increasing the benefit of load shifting from peak hours to off-peak hours.

Next, the operation of the charge and discharge control apparatus 11 on a scheduling day will be described. On a scheduling day, the processing unit 115 of the charge and discharge control apparatus 11 decides time interval(s) where the energy storage 15 discharges power within the adjustment time interval according to a predicted load curve of the electric circuit 13 of the scheduling day. For the adjustment time interval of the scheduling day, if the predicted power demand value of a certain time interval is relatively high (i.e., higher than another peak shaving threshold), the processing unit 115 arranges the energy storage 15 to discharge power within that time interval to reduce the actual consumed power of that time interval and, thereby, reducing the demand charge to be paid by the consumer.

On a scheduling day, the processing unit 115 of the charge and discharge control apparatus 11 may further decide the time interval(s) where the energy storage 15 will be charged within the adjustment time interval of the scheduling day according to the predicted load curve of the electric circuit 13 on the scheduling day. For the adjustment time interval of the scheduling day, if the predicted power demand value of a certain time interval is relatively low (i.e., lower than another customer base line) and that time interval is not within a scheduling time interval, the processing unit 115 arranges the energy storage 15 to be charged within that time interval to increase the actual consumed power in that time interval and, thereby, obtaining more rewards corresponding to a larger demand response load reduction amount due to the customer base line to be calculated in other future scheduling days is raised. It shall be appreciated that when the charge and discharge control apparatus 11 utilizes both the peak shaving threshold and the customer base line on the scheduling day to control charge and discharge of the energy storage 15 within the adjustment time interval, the effect of load shifting from peak hours to off-peak hours can also be achieved, which leads to reduction of the energy charge of the customer.

Moreover, on a scheduling day, the processing unit 115 of the charge and discharge control apparatus 11 may also utilize a residual energy release mechanism. The processing unit 115 arranges the energy storage 15 to release residual energy within a residual energy release time interval in the scheduling time interval so as to obtain rewards from the electric power companies due to the demand response load reduction.

Figure 1K:
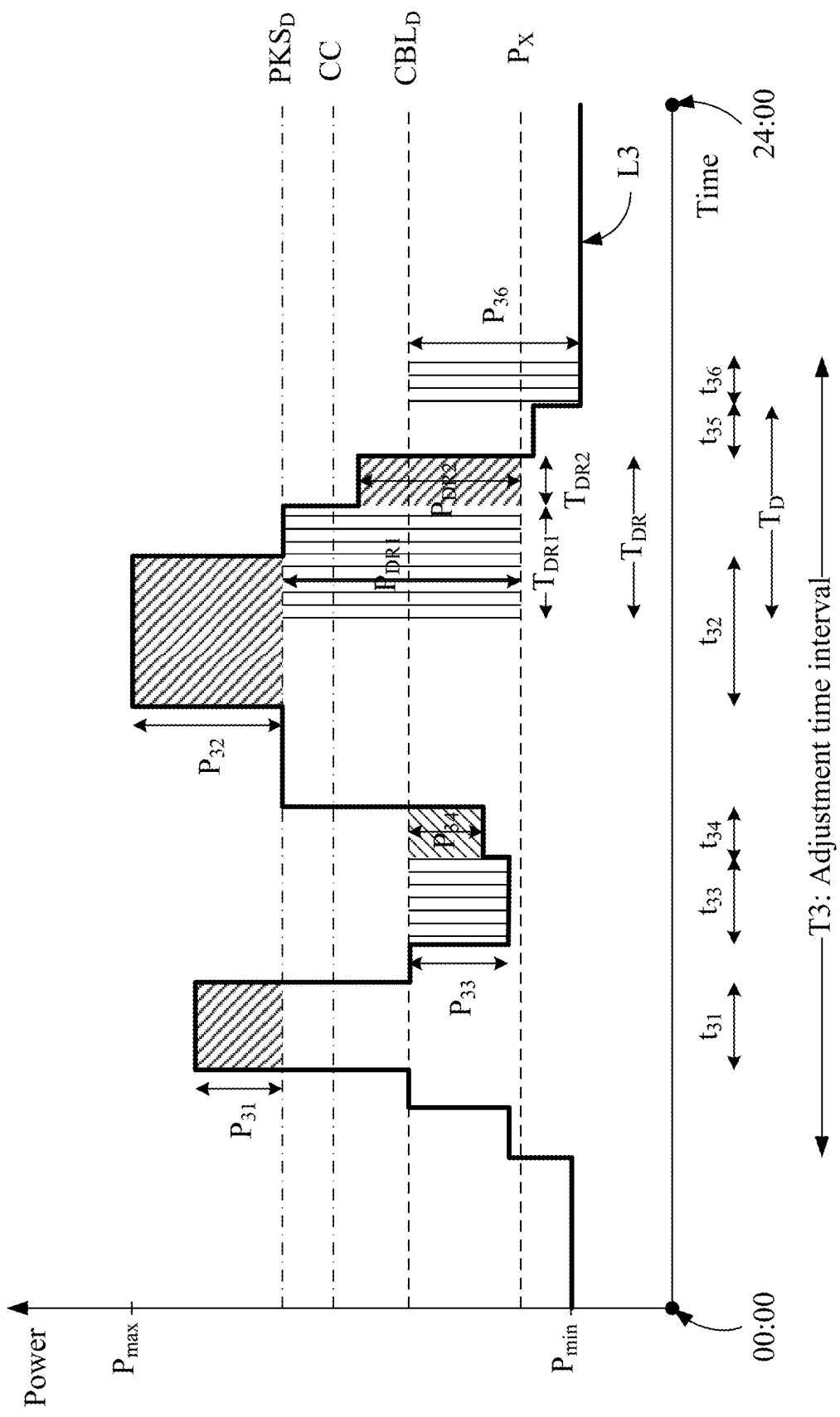
FIG. 1K depicts an exemplary example of operations of the charge and discharge control apparatus 11 on a scheduling day.

For ease of understanding, how the charge and discharge control apparatus 11 manages the charge and discharge of the energy storage 15 in an adjustment time interval T3 of a scheduling day will be detailed by a specific example shown in FIG. 1K. Please note that this specific example is not intended to limit the scope of the present invention. The scheduling day comprises the adjustment time interval T3 and the adjustment time interval T3 comprises a scheduling time interval $T_D$ therein. The range of the adjustment time interval T3 is the same as the ranges of the adjustment time intervals T1 and T2 of the normal day. The scheduling time interval $T_D$ is decided by the electric power company (e.g., on the day before the scheduling day).

The processing unit 115 of the charge and discharge control apparatus 11 calculates a predicted load curve L3 of the electric circuit 13 on the scheduling day before the arrival of the scheduling day. The processing unit 115 decides a peak shaving threshold $PKS_D$ between the contracted capacity CC and a peak $P_{max}$ of the predicted load curve of the electric circuit 13 in the adjustment time interval T3 (i.e., a part of the predicted load curve L3 that corresponds to the adjustment time interval T3). Then, the processing unit 115 decides a plurality of discharge time intervals $t_{31}$ and $t_{32}$ of the energy storage 15 and discharge power values $P_{31}$ and $P_{32}$ respectively corresponding to the discharge time intervals $t_{31}$ and $t_{32}$ according to the peak shaving threshold $PKS_D$ and the predicted load curve of the electric circuit 13 in the adjustment time interval T3 of the scheduling day (i.e., the part of the predicted load curve L3 that corresponds to the adjustment time interval T3).

Briefly speaking, the processing unit 115 determines that the predicted power demand values (recorded in the predicted load curve L3) corresponding to the discharge time intervals $t_{31}$ and $t_{32}$ are higher than the peak shaving threshold $PKS_D$ (i.e., the predicted power demand values are relatively high), so the processing unit 115 arranges the energy storage 15 to discharge at the discharge power values $P_{31}$ and $P_{32}$ respectively in the discharge time interval $t_{31}$ and $t_{32}$ so that the demand charge to be paid by the customer can be reduced due to the actual consumed power of the electric circuit 13 to the power supply system 17 in the discharge time intervals $t_{31}$ and $t_{32}$ is reduced.

Additionally, the processing unit 115 decides a customer base line $CBL_D$ between the contracted capacity CC and a valley value $P_{min}$ of the predicted load curve of the electric circuit 13 in the adjustment time interval T3 (i.e., a part of the predicted load curve L3 that corresponds to the adjustment time interval T3). Then, the processing unit 115 decides a plurality of charge time intervals $t_{33}$, $t_{34}$, and $t_{36}$ of the energy storage 15 and a plurality of charge power values $P_{33}$, $P_{34}$ and $P_{36}$ respectively corresponding to the charge time intervals $t_{33}$, $t_{34}$, and $t_{36}$ according to the scheduling time interval $T_D$, the customer base line $CBL_D$, and the predicted load curve L3. Please note that the processing unit 115 will exclude the scheduling time interval $T_D$ when deciding the charge time intervals on the scheduling day. Hence, although the predicted power demand value corresponding to the time interval $t_{35}$ is lower than the customer base line $CBL_D$, the processing unit 115 will not take the time interval $t_{35}$ as a charge time interval because the time interval $t_{35}$ falls within the scheduling time interval $T_D$. All of the charge time intervals $t_{33}$, $t_{34}$, and $t_{36}$ decided by the processing unit 115 do not fall within the scheduling time interval $T_D$.

Briefly speaking, the processing unit 115 determines that the predicted power demand values corresponding to the charge time intervals $t_{33}$, $t_{34}$, and $t_{36}$ (recorded in the predicted load curve L3) are lower than the customer base line $CBL_D$ (i.e., the predicted power demand values are relatively low) and the charge time intervals $t_{33}$, $t_{34}$, and $t_{36}$ do not fall within the scheduling time interval $T_D$. Hence, the processing unit 115 arranges the energy storage 15 to be charged at the charge power values $P_{33}$, $P_{34}$, and $P_{36}$ respectively in the charge time interval $t_{33}$, $t_{34}$, and $t_{36}$. As a result, the customer base line to be calculated in other further scheduling days is raised due to the actual consumed power of the electric circuit 13 to the power supply system 17 in the charge time intervals $t_{33}$, $t_{34}$ and $t_{36}$ is increased.

Please note that the processing unit 115 may adopt any of the aforesaid methods to decide the peak shaving threshold $PKS_D$ and the customer base line $CBL_D$ for the scheduling day, which will not be further described herein. Please also note that, in some embodiments, the processing unit 115 does not need to decide the customer base line $CBL_D$ and does not need to decide the aforementioned charge time intervals $t_{33}$, $t_{34}$, and $t_{36}$ and the charge powers $P_{33}$, $P_{34}$, and $P_{36}$ for the scheduling day.

In some embodiments, the processing unit 115 further adopts a residual energy release mechanism on a scheduling day. Specifically, when the charge and discharge control apparatus 11 adopts the residual energy release mechanism on the scheduling day, the processing unit 115 determines whether a residual energy storage amount of the energy storage 15 at the end of the adjustment time interval T3 is zero. If the residual energy storage amount of the energy storage 15 at the end of the adjustment time interval T3 is not zero, the processing unit 115 will decide a residual energy release time interval $T_{DR}$ to release the residual energy storage amount of the energy storage 15. Please note that in order to reduce the maximum demand of the scheduling time interval $T_D$, the residual energy release time interval $T_{DR}$ falls within the scheduling time interval $T_D$. In other words, the residual energy release time interval $T_{DR}$ may be the same as the scheduling time interval $T_D$ or may be a part of the scheduling time interval $T_D$. Please also note that the residual energy release time interval $T_{DR}$ may comprise at least one residual energy release sub-time interval, wherein each of the at least one residual energy release sub-time interval corresponds to a residual energy release power value. In the specific example shown in FIG. 1K, the residual energy release time interval $T_{DR}$ comprises two residual energy release sub-time intervals $T_{DR1}$ and $T_{DR2}$, wherein the residual energy release sub-time intervals $T_{DR1}$ and $T_{DR2}$ correspond to residual energy release power values $P_{DR1}$ and $P_{DR2}$ respectively. This means that the processing unit 115 arranges the energy storage 15 to discharge at the residual energy release power values $P_{DR1}$ and $P_{DR2}$ respectively in the residual energy release sub-time intervals $T_{DR1}$ and $T_{DR2}$.

If the charge and discharge control apparatus 11 does not adopt the residual energy release mechanism, the maximum consumed power value of the electric circuit 13 in the scheduling time interval $T_D$ is only reduced to the peak shaving threshold $PKS_D$ from the peak $P_{max}$. If the charge and discharge control apparatus 11 adopts the residual energy release mechanism, the maximum consumed power value of the electric circuit 13 in the scheduling time interval $T_D$ is reduced to a power $P_X$ from the peak shaving threshold $PKS_D$. A customer base line is calculated by the electric power company according to maximum consumed power values of the customers within the same time interval (i.e., a time interval corresponding to the scheduling time interval $T_D$) in the past several days. If the power $P_X$ is lower than the customer base line, the customer base line minus the power $P_X$ is the demand response load reduction amount (i.e., the reduced maximum consumed power value) of the customers within the scheduling time interval of the scheduling day. Then, the electric power company calculates reward for the customers according to the demand response load reduction amounts.

Please note that if the peak shaving threshold $PKS_D$ and the customer base line $CBL_D$ are decided from a plurality of qualified combinations by the processing unit 15, the benefit generated by adopting the residual energy release mechanism can also be taken into consideration during the decision procedure. Specifically, for each of the qualified combinations, the processing unit 115 decides a residual energy release time interval, at least one residual energy release sub-time interval comprised in the residual energy release time interval, and a residual energy release power value corresponding to each of the at least one residual energy release sub-time interval, decides a load adjustment curve according to the candidate peak shaving threshold, the candidate customer base line, the at least one residual energy release sub-time interval, and the residual energy release power value corresponding to each of the at least one residual energy release sub-time interval of the qualified combination, and then calculates an adjustment benefit amount according to the predicted load curve L3 and the load adjustment curve. Thereafter, the processing unit 115 may select the qualified combination corresponding to the greatest adjustment benefit amount as the solution to be adopted. In other words, the processing unit 115 selects the candidate peak shaving threshold and the candidate customer base line comprised in the qualified combination that has the greatest adjustment benefit amount as the peak shaving threshold $PKS_D$ and the customer base line $CBL_D$ used in the adjustment time interval of the scheduling day respectively. Moreover, the processing unit 115 selects the residual energy release time interval and at least one corresponding residual energy release power value comprised in the qualified combination that has the greatest adjustment benefit amount.

Adopting the residual energy release mechanism on the scheduling day can make full use of the residual energy storage amount of the energy storage 15 to reduce the maximum consumed power value in the scheduling time interval $T_D$. In this way, the benefit generated by different electricity price rates at peak hours and off-peak hours can be increased, the demand charge can be reduced, and moreover, higher rewards corresponding to a larger demand response load reduction amount can be obtained.

According to the above descriptions, the charge and discharge control apparatus 11 arranges the energy storage 15 to discharge within an adjustment time interval on a normal day according to a peak shaving threshold so as to reduce so as to reduce the actual consumed power within the adjustment time interval and, thereby, reduce the demand charge to be paid by the customer. The charge and discharge control apparatus 11 arranges the energy storage 15 to be charged within the adjustment time interval on a normal day according to a customer base line so as to increase the actual consumed power within the adjustment time interval and, thereby, the customer base line used in a future scheduling day will be raised and more rewards can be obtained due to a larger demand response load reduction amount. Because the charge and discharge control apparatus 11 utilizes both the peak shaving threshold and the customer base line to control charge and discharge of the energy storage within the adjustment time interval on a normal day, the effect of load shifting from peak hours to off-peak hours can also be achieved, which leads to reduction of the energy charge of the customer. The various effects described above can be enhanced if a residual energy release mechanism is adopted on a normal day.

The charge and discharge control apparatus 11 arranges the energy storage 15 to discharge within an adjustment time interval on a scheduling day so as to reduce the actual consumed power value within the adjustment time interval and, thereby, reduce the demand charge to be paid by the customer. The charge and discharge control apparatus 11 may also utilize a residual energy release mechanism on a scheduling day to arrange the energy storage 15 to release residual energy and, thereby, obtain rewards regarding demand response load reduction from the electric power companies. The charge and discharge control apparatus 11 may further arrange the energy storage 15 to be charged within the adjustment time interval on a scheduling day according to another customer base line so as to increase the actual consumed power within the adjustment time interval and, thereby, the customer base line used in other future scheduling day will be raised and more rewards can be obtained due to a larger demand response load reduction amount.

Figure 2A:
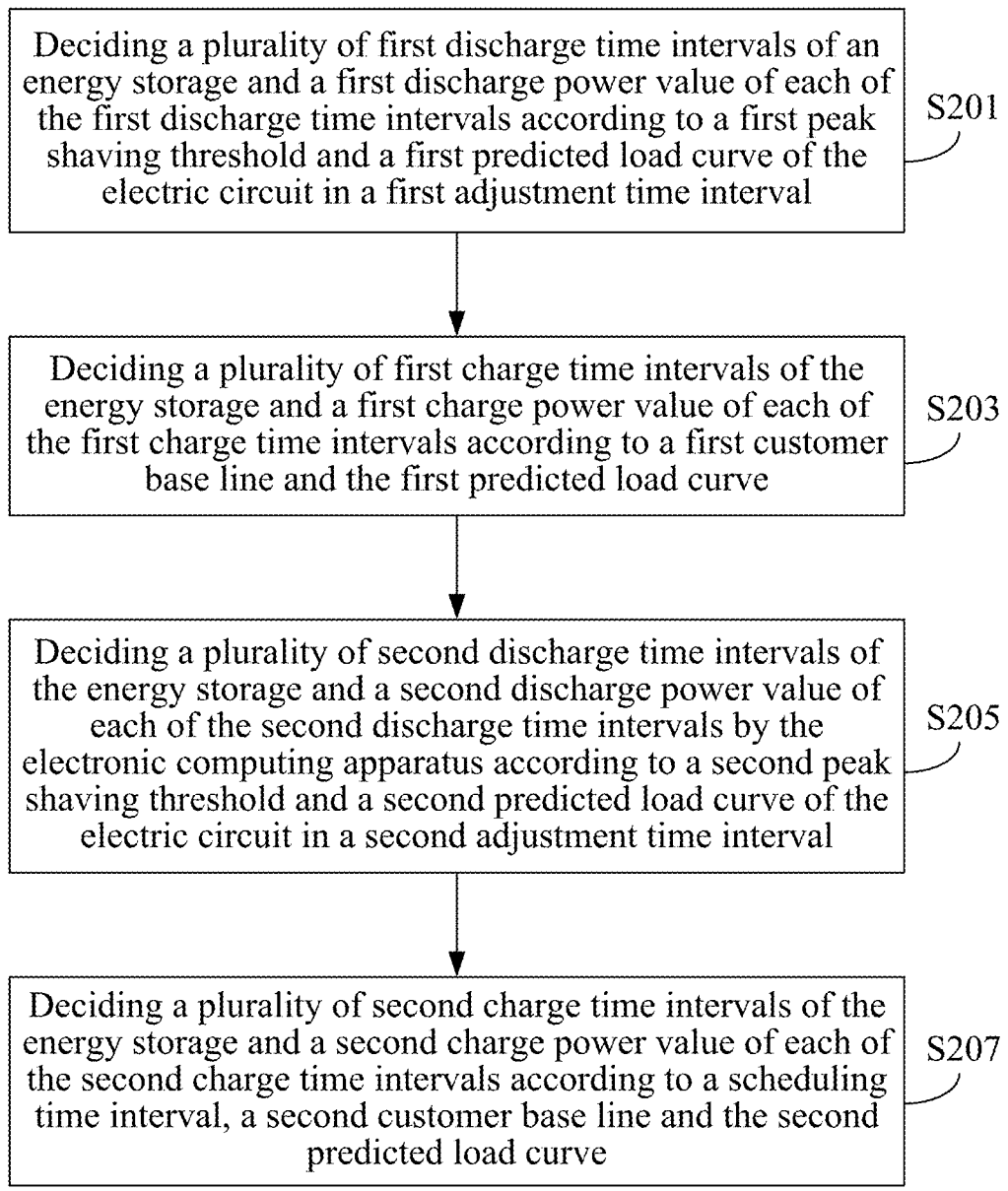
FIG. 2A depicts a flowchart of a charge and discharge method according to a second embodiment.

According to the above descriptions, the charge and discharge control apparatus 11 allows the energy storage 15 to provide multiple services (i.e., load shifting from peak hours to off-peak hours, peak load shaving, and demand response load reduction), allows the customer to obtain more benefits (i.e., reducing the energy charge, reducing the demand charge, and obtaining rewards due to the response demand load reduction), and significantly reduce the load of the power supply systems of the electric power companies within the time intervals of peak demands A second embodiment of the present invention is a charge and discharge control method and a flowchart of which is depicted in FIG. 2A. The charge and discharge control method is adapted for an electronic computing apparatus (e.g., the aforementioned charge and discharge control apparatus 11), and the electronic computing apparatus is adapted to control an energy storage and connected to an electric circuit. Additionally, the energy storage and a power supply system of an electric power company are all connected to the electric circuit and are capable of providing electricity to the electric circuit. Moreover, the energy storage connects to the power supply system of the electric power company. The procedure of the charge and discharge control method will be detailed hereinafter.

The charge and discharge control method executes steps S201 and S203 on a normal day. In the step S201, the electronic computing apparatus decides a plurality of first discharge time intervals of an energy storage and a first discharge power value of each of the first discharge time intervals according to a first peak shaving threshold and a first predicted load curve of the electric circuit in a first adjustment time interval. Please note that the first peak shaving threshold is between a contracted capacity and a peak of the first predicted load curve, wherein a difference between the peak and the first peak shaving threshold is not greater than a maximum discharge power of the energy storage.

Briefly speaking, the charge and discharge control method determines that the predicted power demand values corresponding to the first discharge time intervals (recorded by the first predicted load curve) are higher than the first peak shaving threshold (i.e., the predicted power demand values are relatively high), so the energy storage is arranged to discharge at the first discharge power values in the first discharge time intervals respectively to reduce the actual consumed power value of the power supply system by the electric circuit in the first discharge time intervals and, thereby, reducing the demand charge to be paid by the consumer.

In step S203, the electronic computing apparatus decides a plurality of first charge time intervals of the energy storage and a first charge power value of each of the first charge time intervals according to a first customer base line and the first predicted load curve. It shall be appreciated that, the first customer base line ranges between the contracted capacity and a valley value of the first predicted load curve, and a difference between the first customer base line and the valley value is not greater than a maximum charge power of the energy storage.

Briefly speaking, the charge and discharge control method determines that the predicted power demand values corresponding to the first charge time intervals (recorded by the first predicted load curve) are lower than the first customer base line (i.e., the predicted power demand values are relatively low), so the energy storage is arranged to be charged at the first charge power values in the first charge time intervals respectively to increase the actual consumed power value of the power supply system by the electric circuit in the first charge time intervals and, thereby, raising the customer base line to be calculated in a future scheduling day.

Please note that the order for executing the steps S201 and S203 is not limited in the present invention. In other words, the step S203 may be executed before the step S201, or the step S203 and the step S201 may be executed at the same time.

In some embodiments, the first charge time intervals decided in the step S203 may be in a serration form. When the serration form is adopted, the first charge time intervals are not adjacent to each other. Specifically, in these embodiments, the step S203 may comprise a step to define a plurality of preset charge time intervals within the first adjustment time interval, wherein the duration of each of the preset charge time intervals is the minimum demand calculation unit, the preset charge time intervals are arranged alternately with a plurality of non-charge time intervals (i.e., the preset charge time intervals are not adjacent to each other), and an interval between each preset charge time interval and a next preset charge time interval is shorter than the minimum load-reduction time interval. The step S203 may comprise another step to determine whether the predicted power demand values corresponding to the preset charge time intervals are smaller than the first customer base line. If the predicted power demand value corresponding to a preset charge time interval is smaller than the first customer base line, the preset charge time interval will be selected as a charge time interval.

The charge and discharge control method executes step S205 on a scheduling day. Specifically, in the step S205, the electronic computing apparatus decides a plurality of second discharge time intervals of the energy storage and a second discharge power value of each of the second discharge time intervals according to a second peak shaving threshold and a second predicted load curve of the electric circuit in a second adjustment time interval.

Briefly speaking, the charge and discharge control method determines that the predicted power demand values corresponding to the second discharge time intervals (recorded by the second predicted load curve) are higher than the second peak shaving threshold (i.e., the predicted power demand values are relatively high), so the energy storage is arranged to discharge at the second discharge power values in the second discharge time intervals respectively to reduce the actual consumed power value of the power supply system by the electric circuit in the second discharge time intervals and, thereby, reducing the demand charge to be paid by the consumer.

In some embodiments, the charge and discharge control method may further execute step S207. Specifically, in the step S207, the electronic computing apparatus decides a plurality of second charge time intervals of the energy storage and a second charge power value of each of the second charge time intervals according to a scheduling time interval, a second customer base line, and the second predicted load curve. The second charge time intervals do not fall within the scheduling time interval, and the second customer base line is between the contracted capacity and a valley value of the second predicted load curve.

Briefly speaking, the charge and discharge control method determines that the predicted power demand values corresponding to the second charge time intervals (recorded by the second predicted load curve) are lower than the second customer base line (i.e., the predicted power demand values are relatively low) and the second charge time intervals do not fall within the scheduling time interval, so the energy storage is arranged to be charged at the second charge power values in the second charge time intervals respectively to increase the actual consumed power values of the electric circuit to the power supply system in the second charge time intervals and, thereby, raising the customer base line to be calculated in other future scheduling days.

Figure 2B:
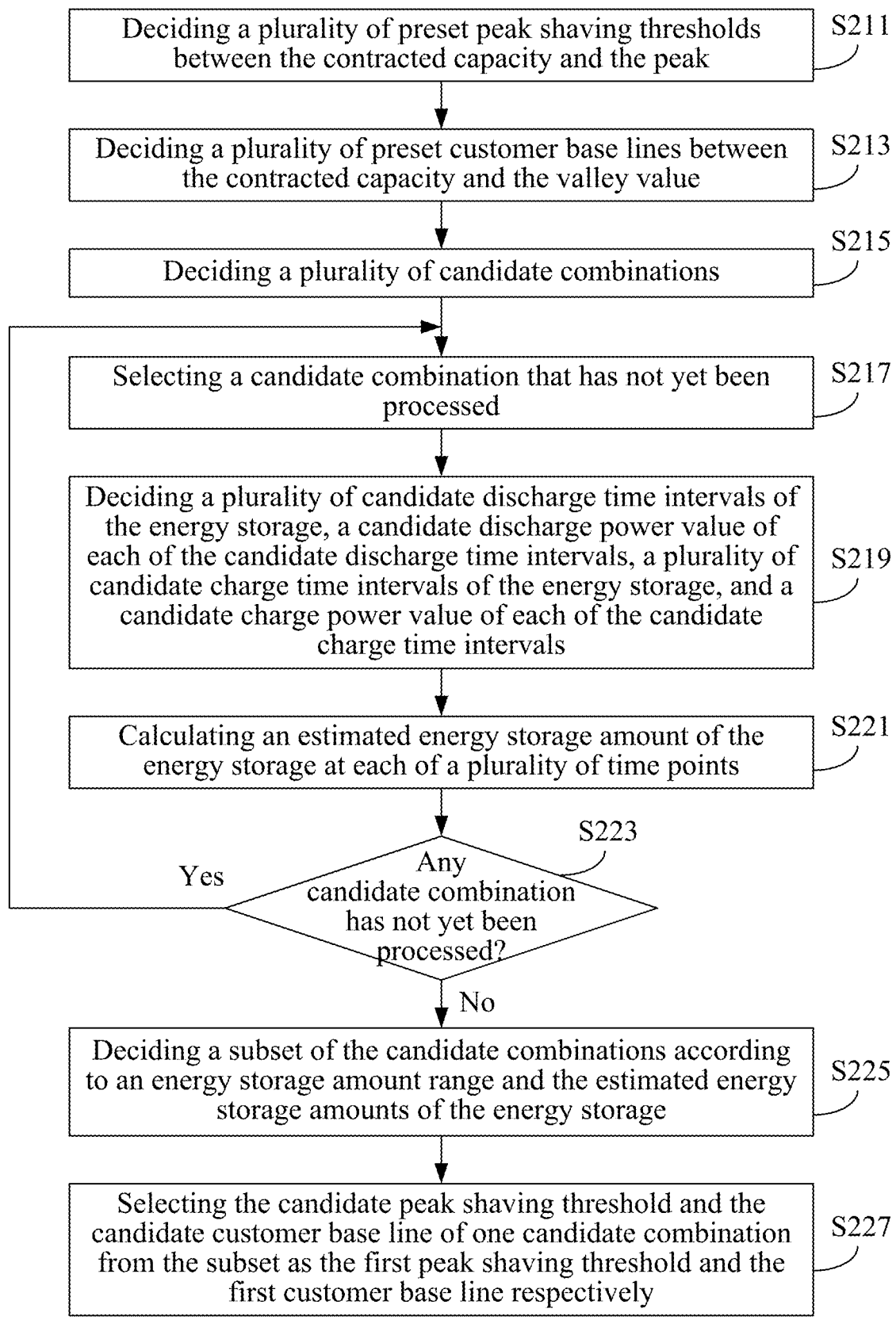
FIG. 2B depicts a flowchart of the charge and discharge control method in deciding the first peak shaving threshold and the first customer base line.

In some implementations, the charge and discharge control method may execute steps shown in FIG. 2B to decide the first peak shaving threshold and the first customer base line.

In step S211, the electronic computing apparatus decides a plurality of preset peak shaving thresholds between the contracted capacity and the peak, wherein a difference between the peak and each of the preset peak shaving thresholds is not greater than the maximum discharge power of the energy storage. Additionally, in step S213, the electronic computing apparatus decides a plurality of preset customer base lines between the contracted capacity and the valley value, wherein a difference between each of the preset customer base lines and the valley value is not greater than the maximum charge power of the energy storage. Please note that the order for executing the steps S211 and S213 is not limited in the present invention. In other words, the step S213 may be executed before the step S211, or the step S213 and the step S211 may be executed at the same time.

In step S215, the electronic computing apparatus decides a plurality of candidate combinations, wherein each of the candidate combinations comprises a candidate peak shaving threshold and a candidate customer base line. Each of the candidate peak shaving thresholds is one of the preset peak shaving thresholds, while each of the candidate customer base lines is one of the preset customer base lines. Thereafter, in step S217, the electronic computing apparatus selects a candidate combination that has not yet been processed from the candidate combinations. In step S219, the electronic computing apparatus decides a plurality of candidate discharge time intervals of the energy storage, a candidate discharge power value of each of the candidate discharge time intervals, a plurality of candidate charge time intervals of the energy storage, and a candidate charge power value of each of the candidate charge time intervals according to the first predicted load curve and the candidate peak shaving threshold and the candidate customer base line of the candidate combination selected in the step S217.

Please note that, in some embodiments, the step S219 may be implemented by two steps, comprising: (a) deciding a plurality of candidate discharge time intervals of the energy storage and a candidate discharge power value of each of the candidate discharge time intervals according to the first predicted load curve and the candidate peak shaving threshold of the candidate combination selected in the step S217, wherein the candidate peak shaving threshold is one of the preset peak shaving thresholds and (b) deciding a plurality of candidate charge time intervals of the energy storage and a candidate charge power value of each of the candidate charge time intervals according to the first predicted load curve and the candidate customer base line of the candidate combination selected in the step S217, wherein the candidate customer base line is one of the preset customer base lines.

In step S221, for the candidate combination selected in the step S217, the electronic computing apparatus calculates an estimated energy storage amount of the energy storage at each of a plurality of time points according to an estimated initial energy storage amount of the energy storage, the candidate discharge power values, and the candidate charge power values. In step S223, the electronic computing apparatus determines if any candidate combination among the candidate combinations has not yet been processed. If the determination result of the step S223 is yes, the steps S217, S219, S221 and S223 are repeated. If the determination result of the step S223 is no, the step S225 is executed.

In step S225, the electronic computing apparatus decides a subset of the candidate combinations according to an energy storage amount range and the estimated energy storage amounts of the energy storage. For example, if all of the estimated energy storage amounts corresponding to a candidate combination overlap with the energy storage amount range of the energy storage, the step S225 puts that candidate combination into the subset. In other words, any candidate combination comprised in the subset is a qualified combination. Next, in step S227, the electronic computing apparatus selects the candidate peak shaving threshold and the candidate customer base line of one candidate combination from the subset as the first peak shaving threshold and the first customer base line respectively.

Please note that, in some embodiments, the charge and discharge control method may perform the following operations for each of the candidate combinations comprised in the subset before executing the step S227: (a) deciding a load adjustment curve of the candidate combination according to the first predicted load curve and the candidate discharge time intervals, the candidate discharge power values, the candidate charge time intervals, and the candidate charge power values of the candidate combination and (b) calculating an adjustment benefit amount of the candidate combination according to the first predicted load curve and the load adjustment curve. In these embodiments, the step S227 selects the candidate peak shaving threshold and the candidate customer base line corresponding to the candidate combinations that has the greatest adjustment benefit amount as the first peak shaving threshold and the first customer base line respectively.

Figure 2C:
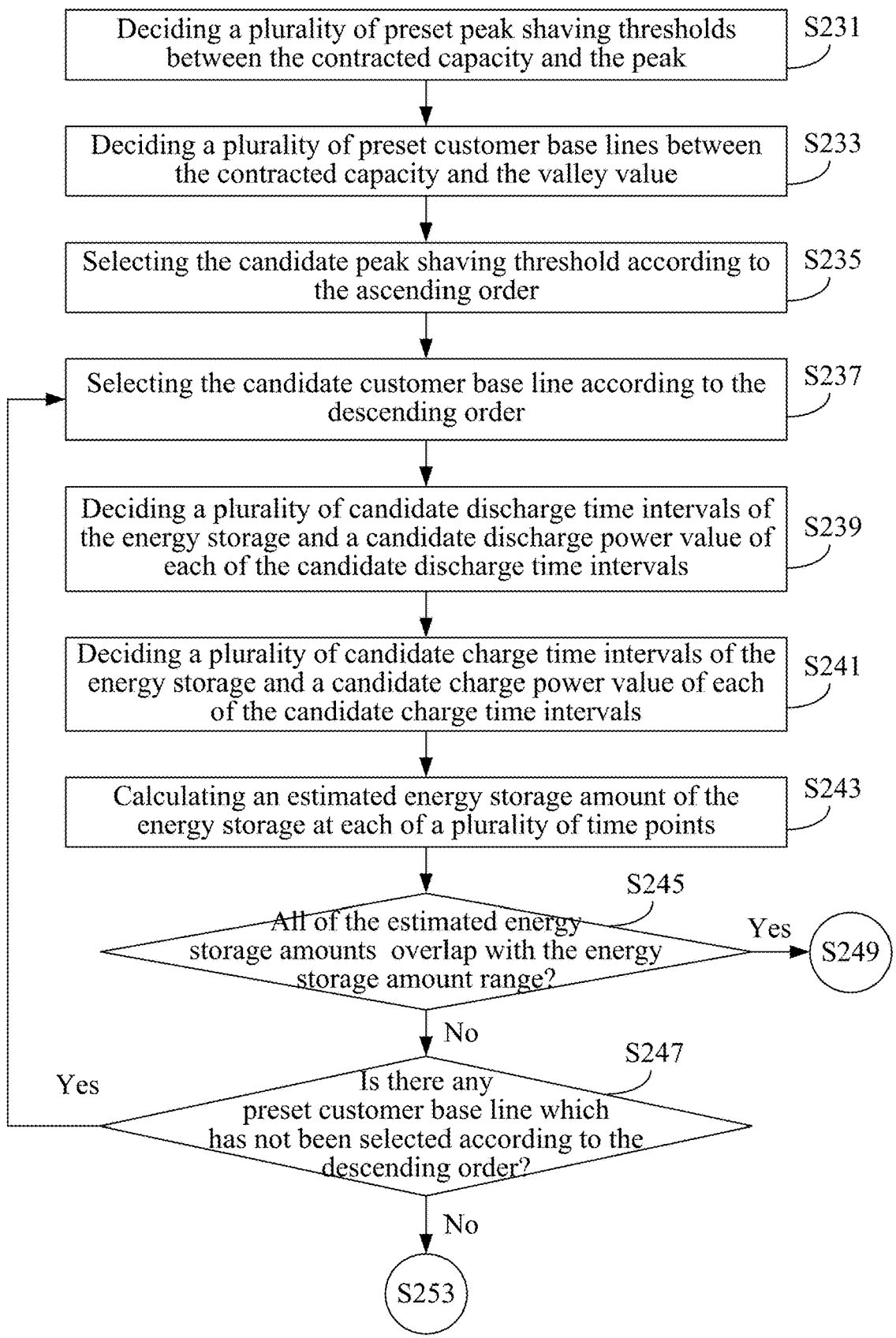
FIGS. 2C and 2D depict a flowchart of a quick searching algorithm that can be adopted by the charge and discharge control method.
Figure 2D:
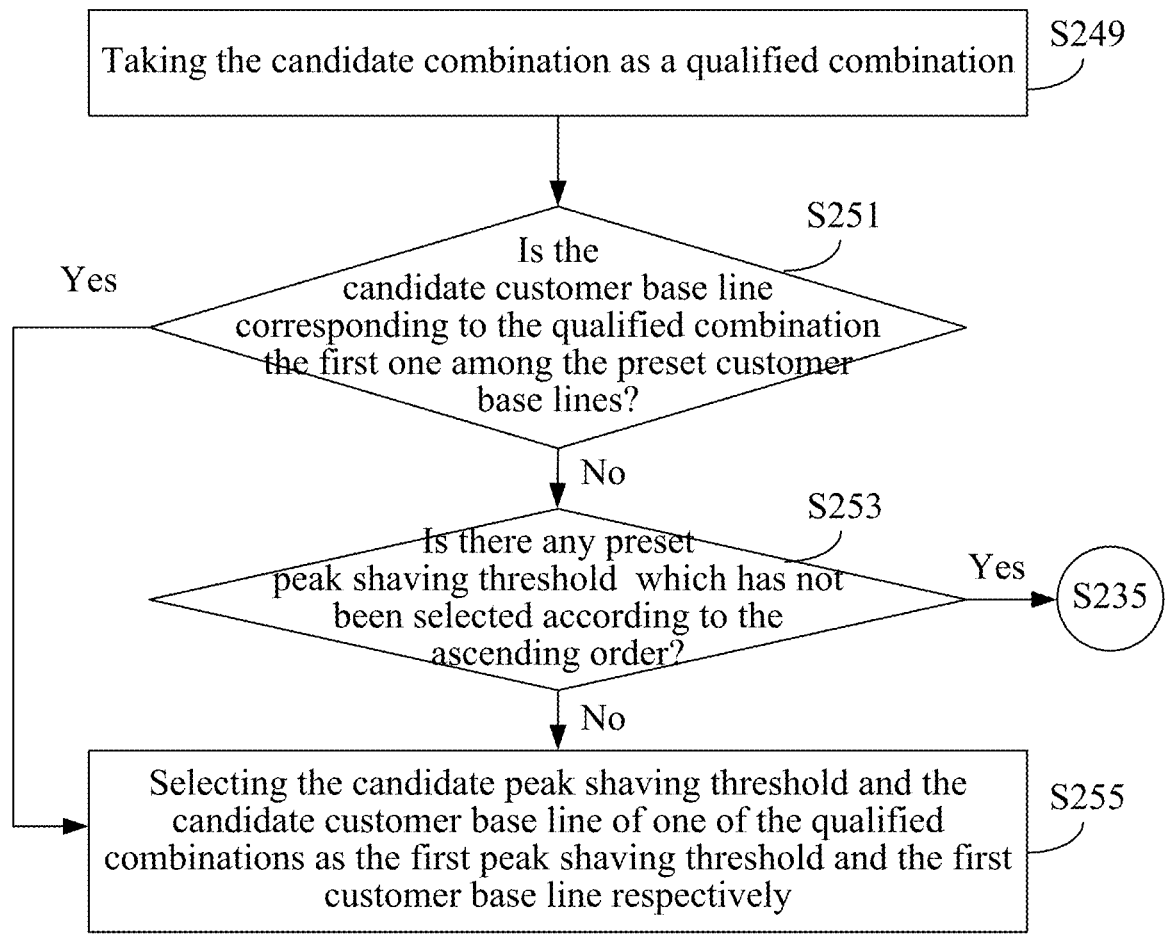

In some embodiments, the charge and discharge control method may execute a quick searching algorithm as shown in FIG. 2C and FIG. 2D to decide the first peak shaving threshold and the first customer base line.

In step S231, the electronic computing apparatus decides a plurality of preset peak shaving thresholds between the contracted capacity and the peak, wherein the preset peak shaving thresholds have an ascending order and a difference between the peak and each of the preset peak shaving thresholds is not greater than the maximum discharge power of the energy storage. Moreover, in step S233, the electronic computing apparatus decides a plurality of preset customer base lines between the contracted capacity and the valley value, wherein the preset customer base lines have a descending order and a difference between each of the preset customer base lines and the valley value is not greater than the maximum charge power of the energy storage. Please note that the order for executing the steps S231 and S233 is not limited in the present invention. In other words, the step S233 may be executed before the step S231, or the step S233 and the step S231 may be executed at the same time.

In step S235, the electronic computing apparatus selects one of the preset peak shaving thresholds as a candidate peak shaving threshold according to the ascending order. In step S237, the electronic computing apparatus selects one of the preset customer base lines as a candidate customer base line according to the descending order. The candidate peak shaving threshold selected in the step S235 and the candidate customer base line selected in the step S237 form a candidate combination. In step S239, the electronic computing apparatus decides a plurality of candidate discharge time intervals of the energy storage and a candidate discharge power value of each of the candidate discharge time intervals according to the first predicted load curve and the candidate peak shaving threshold of the candidate combination. In step S241, the electronic computing apparatus decides a plurality of candidate charge time intervals of the energy storage and a candidate charge power value of each of the candidate charge time intervals according to the first predicted load curve and the candidate customer base line of the candidate combination.

In step S243, the electronic computing apparatus calculates an estimated energy storage amount of the energy storage at each of a plurality of time points according to an estimated initial energy storage amount of the energy storage, the candidate discharge power values, and the candidate charge power values. In step S245, the electronic computing apparatus determines whether all of the estimated energy storage amounts overlap with an energy storage amount range of the energy storage. If the determination result of the step S245 is no, step S247 is executed by the electronic computing apparatus to determine if there is any preset customer base line which has not been selected according to the descending order. If the determination result of the step S247 is yes, the step S237 is then executed.

If the determination result of the step S245 is yes, step S249 is executed by the electronic computing apparatus to take the candidate combination as a qualified combination. Thereafter, step S251 is executed by the electronic computing apparatus to determine whether the candidate customer base line corresponding to the qualified combination is the first one among the preset customer base lines. If the determination result of the step S251 is no, step S253 is then executed. If the determination result of the step S247 is no, the step S253 is then executed. In the step S253, the electronic computing apparatus determines if there is any preset peak shaving threshold which has not been selected according to the ascending order. If the determination result of the step S251 is yes, the step S235 is executed. If the determination result of the step S253 is no, step S255 is executed. If the determination result of the step S251 is yes, the step S255 is also executed. In the step S255, the electronic computing apparatus selects the candidate peak shaving threshold and the candidate customer base line of one of the qualified combinations as the first peak shaving threshold and the first customer base line respectively.

In some embodiments, for each of the qualified combinations, the step S255 may decide a load adjustment curve according to the candidate peak shaving threshold and the candidate customer base line comprised in the qualified combination, and then calculate an adjustment benefit amount according to the first predicted load curve and the load adjustment curve. The adjustment benefit amount may be relevant to an electric charge reduced amount, a demand return, and/or an operation cost of the energy storage. Thereafter, the step S255 may select the candidate peak shaving threshold and the candidate customer base line comprised in the qualified combination that has the greatest adjustment benefit amount as the first peak shaving threshold and the first customer base line respectively.

Please note that the quick searching algorithm shown in FIG. 2C and FIG. 2D considers the preset peak shaving thresholds first. Based on the above descriptions, those of ordinary skill in the art shall appreciate how to decide the first peak shaving threshold and the first customer base line by a quick searching algorithm that considers the customer base lines first and, thus, the details will not be further described herein.

Figure 2E:
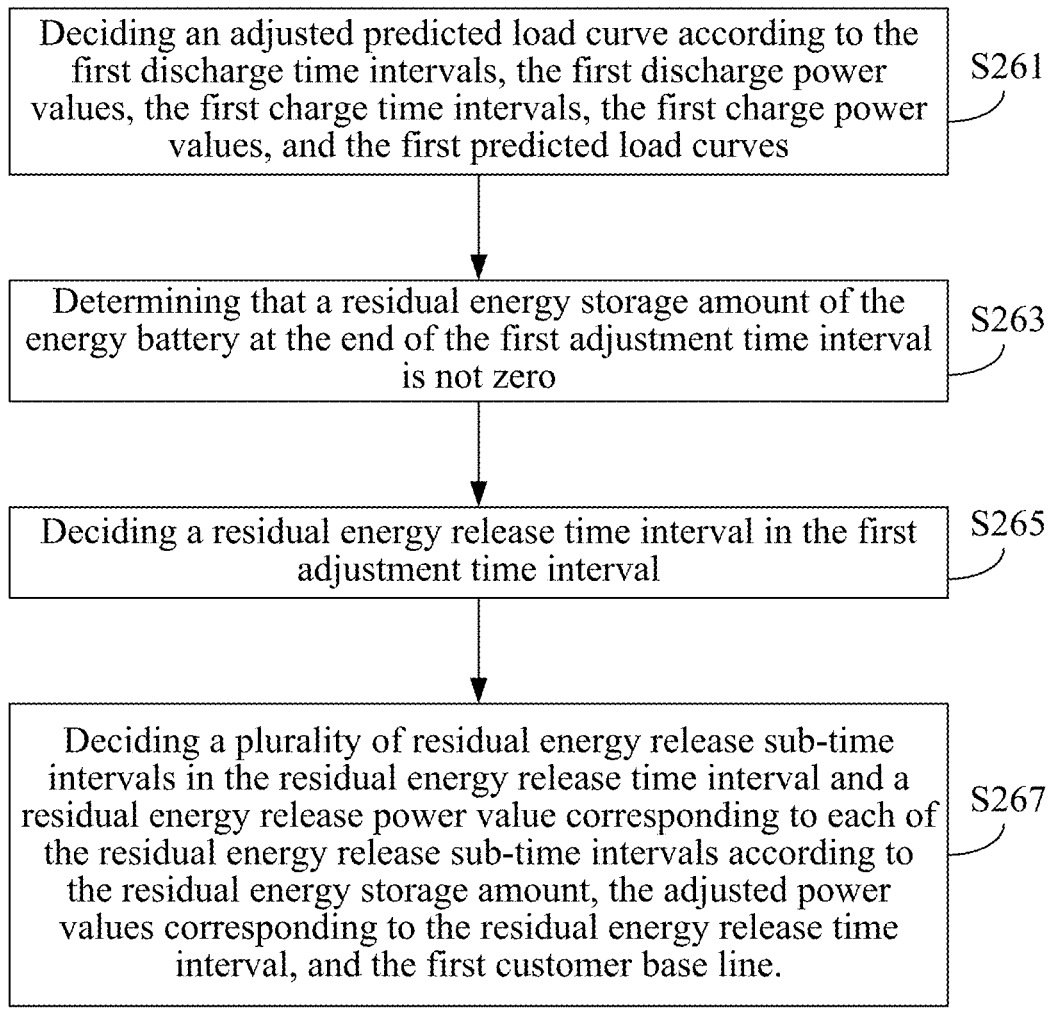
FIG. 2E depicts a flowchart of a residual energy release mechanism that can be adopted by the charge and discharge control method on a normal day.

In some embodiments, the charge and discharge control method may execute the residual energy release mechanism as shown in FIG. 2E after executing the step S203 (i.e., executing a residual energy release mechanism on a normal day).

In step S261, the electronic computing apparatus decides an adjusted predicted load curve according to the first discharge time intervals, the first discharge power values, the first charge time intervals, the first charge power values, and the first predicted load curves, wherein the adjusted predicted load curve comprises a plurality of adjusted power values. In step S263, the electronic computing apparatus determines that a residual energy storage amount of the energy storage at the end of the first adjustment time interval is not zero. Next, in step S265, the electronic computing apparatus decides a residual energy release time interval in the first adjustment time interval, wherein the adjusted power values corresponding to the residual energy release time interval are greater than the first customer base line. In step S267, the electronic computing apparatus decides a plurality of residual energy release sub-time intervals in the residual energy release time interval and a residual energy release power value corresponding to each of the residual energy release sub-time intervals according to the residual energy storage amount, the adjusted power values corresponding to the residual energy release time interval, and the first customer base line. Please note that the adjusted power value of the adjusted predicted load curve that corresponds to each of the residual energy release sub-time intervals minus the corresponding residual energy release power value cannot be lower than the first customer base line. By adopting the residual energy release mechanism on a normal day, the residual energy storage amount of the energy storage can be utilized fully so as to reduce the predicated power demand values in time intervals of which the predicated power demands are still relatively high in the first adjustment time interval as much as possible and, thereby, increasing the benefit generated by different electricity price rates at peak hours and off-peak hours.

It shall be appreciated that, in some embodiments, the charge and discharge control method may also execute a residual energy release mechanism after executing the step S207 (i.e., executing a residual energy release mechanism on a scheduling day). In these embodiments, the charge and discharge control method may execute a step to determine whether the residual energy storage amount of the energy storage at the end of the second adjustment time interval is zero. If the residual energy storage amount of the energy storage at the end of the second adjustment time interval is not zero, the charge and discharge control method may execute a step to decide a residual energy release time interval. In order to reduce the maximum demand of the scheduling time interval, the residual energy release time interval falls within the scheduling time interval. Additionally, the residual energy release time interval may comprise at least one residual energy release sub-time interval, wherein each of the at least one residual energy release sub-time interval corresponds to a residual energy release power value.

Figure 2F:
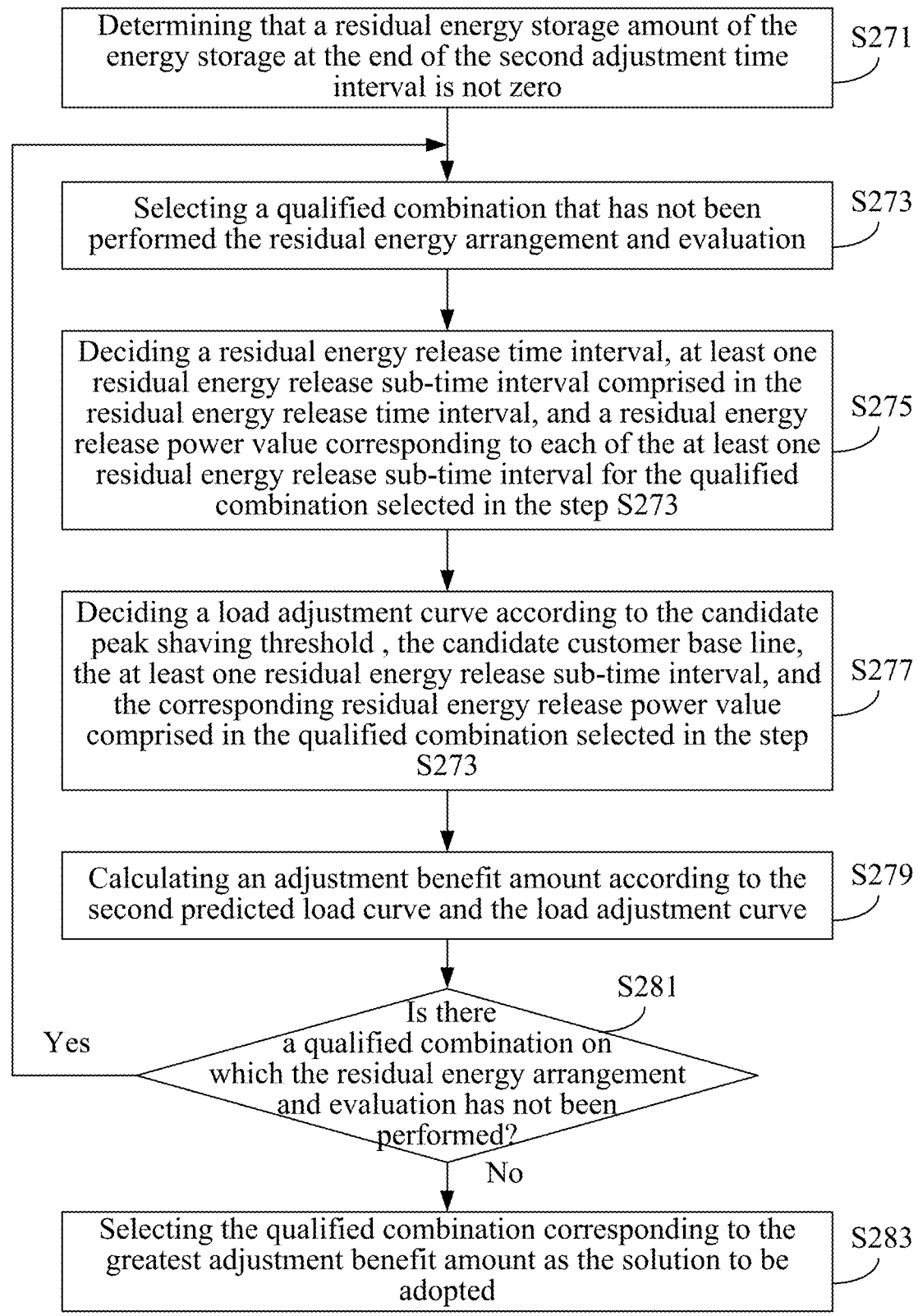
FIG. 2F depicts a flowchart of another residual energy release mechanism that can be adopted by the charge and discharge control method on a scheduling day.

In some embodiments, if the charge and discharge control method decides the second peak shaving threshold and the second customer base line from several qualified combinations, the residual energy release mechanism shown in FIG. 2F may further be executed. In step S271, the electronic computing apparatus determines that a residual energy storage amount of the energy storage at the end of the second adjustment time interval is not zero. In step S273, the electronic computing apparatus selects a qualified combination that has not been performed the residual energy arrangement and evaluation. In step S275, the electronic computing apparatus decides a residual energy release time interval, at least one residual energy release sub-time interval comprised in the residual energy release time interval, and a residual energy release power value corresponding to each of the at least one residual energy release sub-time interval for the qualified combination selected in the step S273. In step S277, the electronic computing apparatus decides a load adjustment curve according to the candidate peak shaving threshold, the candidate customer base line, the at least one residual energy release sub-time interval, and the corresponding residual energy release power value comprised in the qualified combination selected in the step S273. In step S279, the electronic computing apparatus calculates an adjustment benefit amount according to the second predicted load curve and the load adjustment curve. In step S281, the electronic computing apparatus determines whether there is a qualified combination on which the residual energy arrangement and evaluation has not been performed. If the determination result of the step S281 is yes, the step S273 is executed. If the determination result of the step S281 is no, step S283 is executed.

In the step S283, the electronic computing apparatus selects the qualified combination corresponding to the greatest adjustment benefit amount as the solution to be adopted. In other words, the step S283 selects the candidate peak shaving threshold and the candidate customer base line comprised in the qualified combination that has the greatest adjustment benefit amount as the second peak shaving threshold and the second customer base line respectively. Moreover, the step S283 selects the at least one residual energy release time interval and the at least one corresponding residual energy release power value comprised in the qualified combination that has the greatest adjustment benefit amount.

Adopting the residual energy release mechanism on a scheduling day can make full use of the residual energy storage amount of the energy storage to reduce the maximum consumed power value in the scheduling time interval. In this way, the benefit generated by different electricity price rates at peak hours and off-peak hours can be improved, the demand charge can be reduced, and moreover, higher rewards corresponding to a larger demand response load reduction amount can be obtained.

In addition to the aforesaid steps, the second embodiment can also execute all the operations and steps set forth in the first embodiment, have the same functions, and deliver the same technical effects as the first embodiment. How the second embodiment executes these operations and steps, has the same functions, and delivers the same technical effects as the first embodiment shall be readily appreciated by those of ordinary skill in the art based on the above explanation of the first embodiment, and thus will not be further described herein.

It shall be appreciated that, in the specification and the claims of the present invention, terms "first" and "second" used in the first peak shaving threshold and the second peak shaving threshold are only used to mean that these peak shaving thresholds are different from each other, and the terms "first" and "second" used in the first customer base line and the second customer base line are only used to mean that these customer base lines are different from each other.

The terms "first" and "second" used in the first discharge time interval and the second discharge time interval are only used to mean that these discharge time intervals are decided at different stages, and the terms "first" and "second" used in the first discharge power value and the second discharge power value are only used to mean that these discharge power values are decided at different stages. The terms "first" and "second" used in the first charge time interval and the second charge time interval are only used to mean that these charge time intervals are decided at different stages, and the terms "first" and "second" used in the first charge power value and the second charge power value are only used to mean that these charge powers are decided at different stages. The terms "first" and "second" used in the first sequence and the second sequence are only used to mean that these sequences are different from each other. The terms "first" and "second" used in the first adjustment time interval and the second adjustment time interval are only used to means that these adjustment time intervals are different from each other. The terms "first," "second," "third," and "fourth" used in the first candidate combination, the second candidate combination, the third candidate combination, and the fourth candidate combination are only used to mean that these candidate combinations are different from each other.

According to the above descriptions, the charge and discharge control technology (at least including the charge and discharge control apparatus and method) provided in the present invention enables an energy storage to provide multiple services (i.e., load shifting from the peak hours to off-peak hours, peak load shaving, and demand response load reduction).

The charge and discharge control technology provided in the present invention arranges the energy storage to discharge within an adjustment time interval on a normal day according to a peak shaving threshold so as to reduce the actual consumed power value within the adjustment time interval and, thereby, reduce the demand charge to be paid by the customer. The charge and discharge control technology provided in the present invention arranges the energy storage to be charged within the adjustment time interval on a normal day according to a customer base line so as to increase the actual consumed power value within the adjustment time interval and, thereby, the customer base line used in a future scheduling day will be raised and more rewards can be obtained due to a larger demand response load reduction amount. Because the charge and discharge control technology provided in the present invention utilizes both the peak shaving threshold and the customer base line on a normal day to control charge and discharge of the energy storage within the adjustment time interval, the effect of load shifting from peak hours to off-peak hours can be achieved as well, which leads to the reduction of the energy charge of the customer. Moreover, the charge and discharge control technology provided in the present invention further provides a residual energy release mechanism for a normal day to enhance various effects described above.

The charge and discharge control technology provided in the present invention arranges the energy storage to discharge within an adjustment time interval on a scheduling day according to another peak shaving threshold so as to reduce the actual consumed power within the adjustment time interval and, thereby, reduce the demand charge to be paid by the customer. The charge and discharge control technology provided in the present invention may further utilize a residual energy release mechanism on a scheduling day to arrange the energy storage to release residual energy within a scheduling time interval and, thereby, obtain rewards regarding demand response load reduction from the electric power companies. The charge and discharge control technology provided in the present invention may also utilize arrange the energy storage to be charged within the adjustment time interval on a scheduling day according to another customer base line so as to increase the actual consumed power value within the adjustment time interval and, thereby, the customer base line used in other future scheduling day will be raised and more rewards can be obtained due to a larger demand response load reduction amount.

According to the above descriptions, the charge and discharge control technology provided in the present invention enables an energy storage to provide multiple services (i.e., load shifting from peak hours to off-peak hours, peak load shaving, and demand response load reduction), allows the customer to obtain more benefits (i.e., reducing the energy charge, reducing the demand charge, and obtaining rewards due to the response demand load reduction), and significantly reduces the load of the power supply systems of the electric power companies within time intervals of peak demand.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A charge and discharge control apparatus, comprising:
an interface, being electrically connected to an electric circuit; and
a processing unit, being electrically connected to the interface and configured to decide a first peak shaving threshold between a contracted capacity and a peak of a first predicted load curve of the electric circuit in a first adjustment time interval, decide a first customer base line between the contracted capacity and a valley value of the first predicted load curve of the electric circuit in the first adjustment time interval, decide a plurality of first discharge time intervals of an energy storage and a first discharge power value of each of the first discharge time intervals according to the first peak shaving threshold and the first predicted load curve, and decide a plurality of first charge time intervals of the energy storage and a first charge power value of each of the first charge time intervals according to the first customer base line and the first predicted load curve,
wherein the first predicted load curve comprises a plurality of predicted power demand values corresponding to a plurality of time intervals respectively,
wherein a difference between the peak and the first peak shaving threshold is not greater than a maximum discharge power of the energy storage and a difference between the first customer base line and the valley value is not greater than a maximum charge power of the energy storage.

2. The charge and discharge control apparatus of claim 1, wherein the first charge time intervals are not adjacent to each other.

3. The charge and discharge control apparatus of claim 1, wherein the processing unit decides a plurality of preset peak shaving thresholds between the contracted capacity and the peak, a difference between the peak and each of the preset peak shaving thresholds is not greater than the maximum discharge power of the energy storage, the processing unit decides a plurality of preset customer base lines between the contracted capacity and the valley value, a difference between each of the preset customer base lines and the valley value is not greater than the maximum charge power of the energy storage, the processing unit decides a plurality of candidate combinations, each of the candidate combinations comprises a candidate peak shaving threshold and a candidate customer base line, each of the candidate peak shaving thresholds is one of the preset peak shaving thresholds, each of the candidate customer base lines is one of the preset customer base lines, and the processing unit performs the following operations on each of the candidate combinations:
deciding a plurality of candidate discharge time intervals of the energy storage, a candidate discharge power value of each of the candidate discharge time intervals, a plurality of candidate charge time intervals of the energy storage, and a candidate charge power value of each of the candidate charge time intervals according to the first predicted load curve, the candidate peak shaving threshold of the candidate combination, and the candidate customer base line of the candidate combination,
calculating an estimated energy storage amount of the energy storage at each of a plurality of time points according to an estimated initial energy storage amount of the energy storage, the candidate discharge power values, and the candidate charge power values,
wherein the processing unit decides a subset of the candidate combinations according to an energy storage amount range and the estimated energy storage amounts of the energy storage and selects the candidate peak shaving threshold and the candidate customer base line of one candidate combination from the subset as the first peak shaving threshold and the first customer base line respectively.

4. The charge and discharge control apparatus of claim 1, wherein the processing unit decides a plurality of preset peak shaving thresholds between the contracted capacity and the peak, a difference between the peak and each of the preset peak shaving thresholds is not greater than the maximum discharge power of the energy storage, the processing unit decides a plurality of preset customer base lines between the contracted capacity and the valley value, a difference between each of the preset customer base lines and the valley value is not greater than the maximum charge power of the energy storage, the processing unit decides a plurality of candidate combinations, each of the candidate combinations comprises a candidate peak shaving threshold and a candidate customer base line, each of the candidate peak shaving thresholds is one of the preset peak shaving thresholds, each of the candidate customer base lines is one of the preset customer base lines, and the processing unit performs the following operations on each of the candidate combinations:
deciding a plurality of candidate discharge time intervals of the energy storage and a candidate discharge power value of each of the candidate discharge time intervals according to the first predicted load curve and the candidate peak shaving threshold of the candidate combination,
deciding a plurality of candidate charge time intervals of the energy storage and a candidate charge power value of each of the candidate charge time intervals according to the first predicted load curve and the candidate customer base line of the candidate combination, and calculating an estimated energy storage amount of the energy storage at each of a plurality of time points according to an estimated initial energy storage amount of the energy storage, the candidate discharge power values, and the candidate charge power values, wherein the processing unit decides a subset of the candidate combinations according to an energy storage amount range and the estimated energy storage amounts of the energy storage and selects the candidate peak shaving threshold and the candidate customer base line of one candidate combination from the subset as the first peak shaving threshold and the first customer base line respectively.

5. The charge and discharge control apparatus of claim 4, wherein the processing unit performs the following operations for each of the candidate combinations comprised in the subset:

deciding a load adjustment curve of the candidate combination according to the first predicted load curve and the candidate discharge time intervals, the candidate discharge power values, the candidate charge time intervals, and the candidate charge power values of the candidate combination, and calculating an adjustment benefit amount of the candidate combination according to the first predicted load curve and the load adjustment curve, wherein the processing unit selects the candidate peak shaving threshold and the candidate customer base line corresponding to the candidate combination that has the greatest adjustment benefit amount as the first peak shaving threshold and the first customer base line respectively.

6. The charge and discharge control apparatus of claim 1, wherein the processing unit decides a plurality of preset peak shaving thresholds between the contracted capacity and the peak, the preset peak shaving thresholds have an ascending order, a difference between the peak and each of the preset peak shaving thresholds is not greater than the maximum discharge power of the energy storage, the processing unit decides a plurality of preset customer base lines between the contracted capacity and the valley value, the preset customer base lines have a descending order, a difference between each of the preset customer base lines and the valley value is not greater than the maximum charge power of the energy storage, and the processing unit further performs the following operations:

(a) selecting one of the preset peak shaving thresholds as a candidate peak shaving threshold according to the ascending order;

(b) performing the following operations for the candidate peak shaving threshold:

(b1) selecting one of the preset customer base lines as a candidate customer base line according to the descending order and taking the candidate peak shaving threshold and the candidate customer base line as a candidate combination, (b2) deciding a plurality of candidate discharge time intervals of the energy storage and a candidate discharge power value of each of the candidate discharge time intervals according to the first predicted load curve and the candidate peak shaving threshold of the candidate combination, (b3) deciding a plurality of candidate charge time intervals of the energy storage and a candidate charge power value of each of the candidate charge time intervals according to the first predicted load curve and the candidate customer base line of the candidate combination, (b4) calculating an estimated energy storage amount of the energy storage at each of a plurality of time points according to an estimated initial energy storage amount of the energy storage, the candidate discharge power values, and the candidate charge power values, (b5) determining whether all of the estimated energy storage amounts overlap with an energy storage amount range of the energy storage, and (b6) taking the candidate combination as a qualified combination if all of the estimated energy storage amounts overlap with the energy storage amount range, or repeating the operations (b1) to (b6) if not all of the estimated energy storage amounts overlap with the energy storage amount range, (c) determining whether the candidate customer base line comprised in the qualified combination is the first one among the preset customer base lines, and (d) repeating the operations (a) to (d) if the candidate customer base line comprised in the qualified combination is not the first one among the preset customer base lines, wherein the processing unit selects the candidate peak shaving threshold and the candidate customer base line of one of the qualified combinations as the first peak shaving threshold and the first customer base line respectively.

7. The charge and discharge control apparatus of claim 1, wherein the processing unit decides a plurality of preset peak shaving thresholds between the contracted capacity and the peak, the preset peak shaving thresholds have an ascending order, a difference between the peak and each of the preset peak shaving thresholds is not greater than the maximum discharge power of the energy storage, the processing unit decides a plurality of preset customer base lines between the contracted capacity and the valley value, the preset customer base lines have a descending order, a difference between each of the preset customer base lines and the valley value is not greater than the maximum charge power of the energy storage, and the processing unit further performs the following operations:

(a) selecting one of the preset customer base lines as a candidate customer base line according to the descending order;

(b) performing the following operations for the candidate customer base line:

(b1) selecting one of the preset peak shaving thresholds as a candidate peak shaving threshold according to the ascending order and taking the candidate peak shaving threshold and the candidate customer base line as a candidate combination, (b2) deciding a plurality of candidate discharge time intervals of the energy storage and a candidate discharge power value of each of the candidate discharge time intervals according to the first predicted load curve and the candidate peak shaving threshold of the candidate combination, (b3) deciding a plurality of candidate charge time intervals of the energy storage and a candidate charge power value of each of the candidate charge time intervals according to the first predicted load curve and the candidate customer base line of the candidate combination, (b4) calculating an estimated energy storage amount of the energy storage at each of a plurality of time points according to an estimated initial energy storage amount of the energy storage, the candidate discharge power values, and the candidate charge power values, (b5) determining whether all of the estimated energy storage amounts overlap with an energy storage amount range of the energy storage, and (b6) taking the candidate combination as a qualified combination if all of the estimated energy storage amounts overlap with the energy storage amount range, or repeating the operations (b1) to (b6) if not all of the estimated energy storage amounts overlap with the energy storage amount range, (c) determining whether the candidate peak shaving threshold corresponding to the qualified combination is the first one among the preset peak shaving thresholds, and (d) repeating the operations (a) to (d) if the candidate peak shaving threshold corresponding to the qualified combination is not the first one among the preset peak shaving thresholds, wherein the processing unit selects the candidate peak shaving threshold and the candidate customer base line of one of the qualified combinations as the first peak shaving threshold and the first customer base line respectively.

8. The charge and discharge control apparatus of claim 1, wherein the processing unit decides an adjusted predicted load curve according to the first discharge time intervals, the first discharge power values, the first charge time intervals, the first charge power values, and the first predicted load curves, the adjusted predicted load curve comprises a plurality of adjusted power values, the processing unit determines that a residual energy storage amount of the energy storage at the end of the first adjustment time interval is not zero, the processing unit decides a residual energy release time interval in the first adjustment time interval, the adjusted power values corresponding to the residual energy release time interval are greater than the first customer base line, and the processing unit decides at least one residual energy release sub-time interval in the residual energy release time interval and a residual energy release power value corresponding to each of the at least one residual energy release sub-time interval according to the residual energy storage amount, the adjusted power values corresponding to the residual energy release time interval, and the first customer base line.

9. The charge and discharge control apparatus of claim 1, wherein the processing unit decides a plurality of second discharge time intervals of the energy storage and a second discharge power value of each of the second discharge time intervals according to a second peak shaving threshold and a second predicted load curve of the electric circuit in a second adjustment time interval and decides a discharge power value of a scheduling time interval in the second adjustment time interval, wherein the second peak shaving threshold is between the contracted capacity and a peak of the second predicted load curve.

10. The charge and discharge control apparatus of claim 9, wherein the processing unit determines that a residual energy storage amount of the energy storage at the end of the second adjustment time interval is not zero, the processing unit decides a residual energy release time interval, and the residual energy release time interval falls within the scheduling time interval.

11. The charge and discharge control apparatus of claim 9, wherein the processing unit decides a plurality of second charge time intervals of the energy storage and a second charge power value of each of the second charge time intervals according to the scheduling time interval, a second customer base line, and the second predicted load curve, wherein the second charge time intervals do not fall within the scheduling time interval, and the second customer base line is between the contracted capacity and a valley value of the second predicted load curve.

12. The charge and discharge control apparatus of claim 11, wherein the processing unit determines that a residual energy storage amount of the energy storage at the end of the second adjustment time interval is not zero, the processing unit decides a residual energy release time interval, and the residual energy release time interval falls within the scheduling time interval.

13. A charge and discharge control method for an electronic computing apparatus, the electronic computing apparatus being adapted to control an energy storage and connected to an electric circuit, and the charge and discharge control method comprising:

deciding a first peak shaving threshold between a contracted capacity and a peak of a first predicted load curve of the electric circuit in a first adjustment time interval, wherein the first predicted load curve comprises a plurality of predicted power demand values corresponding to a plurality of time intervals respectively;

deciding a first customer base line between the contracted capacity and a valley value of the first predicted load curve of the electric circuit in the first adjustment time interval;

deciding a plurality of first discharge time intervals of an energy storage and a first discharge power value of each of the first discharge time intervals according to the first peak shaving threshold and the first predicted load curve, wherein a difference between the peak and the first peak shaving threshold is not greater than a maximum discharge power of the energy storage; and deciding a plurality of first charge time intervals of the energy storage and a first charge power value of each of the first charge time intervals according to the first customer base line and the first predicted load curve, wherein a difference between the first customer base line and the valley value is not greater than a maximum charge power of the energy storage.

14. The charge and discharge control method of claim 13, wherein the first charge time intervals are not adjacent to each other.

15. The charge and discharge control method of claim 13, further comprising:

deciding a plurality of preset peak shaving thresholds between the contracted capacity and the peak, wherein a difference between the peak and each of the preset peak shaving thresholds is not greater than the maximum discharge power of the energy storage;

deciding a plurality of preset customer base lines between the contracted capacity and the valley value, wherein a difference between each of the preset customer base lines and the valley value is not greater than the maximum charge power of the energy storage;

deciding a plurality of candidate combinations, wherein each of the candidate combinations comprises a candidate peak shaving threshold and a candidate customer base line, each of the candidate peak shaving thresholds is one of the preset peak shaving thresholds, and each of the candidate customer base lines is one of the preset customer base lines;

performing the following steps for each of the candidate combinations:

deciding a plurality of candidate discharge time intervals of the energy storage, a candidate discharge power value of each of the candidate discharge time intervals, a plurality of candidate charge time intervals of the energy storage, and a candidate charge power value of each of the candidate charge time intervals according to the first predicted load curve, the candidate peak shaving threshold of the candidate combination, and the candidate customer base line of the candidate combination; and calculating an estimated energy storage amount of the energy storage at each of a plurality of time points according to an estimated initial energy storage amount of the energy storage, the candidate discharge power values, and the candidate charge power values;

deciding a subset of the candidate combinations according to an energy storage amount range and the estimated energy storage amounts of the energy storage; and selecting the candidate peak shaving threshold and the candidate customer base line of one candidate combination from the subset as the first peak shaving threshold and the first customer base line respectively.

16. The charge and discharge control method of claim 13, further comprising:

deciding a plurality of preset peak shaving thresholds between the contracted capacity and the peak, wherein a difference between the peak and each of the preset peak shaving thresholds is not greater than the maximum discharge power of the energy storage;

deciding a plurality of preset customer base lines between the contracted capacity and the valley value, wherein a difference between each of the preset customer base lines and the valley value is not greater than the maximum charge power of the energy storage;

deciding a plurality of candidate combinations, wherein each of the candidate combinations comprises a candidate peak shaving threshold and a candidate customer base line, each of the candidate peak shaving thresholds is one of the preset peak shaving thresholds, and each of the candidate customer base lines is one of the preset customer base lines;

performing the following steps for each of the candidate combinations:

deciding a plurality of candidate discharge time intervals of the energy storage and a candidate discharge power value of each of the candidate discharge time intervals according to the first predicted load curve and the candidate peak shaving threshold of the candidate combination;

deciding a plurality of candidate charge time intervals of the energy storage and a candidate charge power value of each of the candidate charge time intervals according to the first predicted load curve and the candidate customer base line of the candidate combination; and calculating an estimated energy storage amount of the energy storage at each of a plurality of time points according to an estimated initial energy storage amount of the energy storage, the candidate discharge power values, and the candidate charge power values;

deciding a subset of the candidate combinations according to an energy storage amount range and the estimated energy storage amounts of the energy storage; and selecting the candidate peak shaving threshold and the candidate customer base line of one candidate combination from the subset as the first peak shaving threshold and the first customer base line respectively.

17. The charge and discharge control method of claim 16, further comprising:

performing the following steps for each of the candidate combinations comprised in the subset:

deciding a load adjustment curve of the candidate combination according to the first predicted load curve and the candidate discharge time intervals, the candidate discharge power values, the candidate charge time intervals, and the candidate charge power values of the candidate combination; and calculating an adjustment benefit amount of the candidate combination according to the first predicted load curve and the load adjustment curve, wherein the selecting step selects the candidate peak shaving threshold and the candidate customer base line corresponding to the candidate combination that has the greatest adjustment benefit amount as the first peak shaving threshold and the first customer base line respectively.

18. The charge and discharge control method of claim 13, further comprising:

(a) deciding a plurality of preset peak shaving thresholds between the contracted capacity and the peak, wherein the preset peak shaving thresholds have an ascending order and a difference between the peak and each of the preset peak shaving thresholds is not greater than the maximum discharge power of the energy storage;

(b) deciding a plurality of preset customer base lines between the contracted capacity and the valley value, wherein the preset customer base lines have a descending order and a difference between each of the preset customer base lines and the valley value is not greater than the maximum charge power of the energy storage;

(c) selecting one of the preset peak shaving thresholds as a candidate peak shaving threshold according to the ascending order;

(d) performing the following steps for the candidate peak shaving threshold:

(d1) selecting one of the preset customer base lines as a candidate customer base line according to the descending order and taking the candidate peak shaving threshold and the candidate customer base line as a candidate combination;

(d2) deciding a plurality of candidate discharge time intervals of the energy storage and a candidate discharge power value of each of the candidate discharge time intervals according to the first predicted load curve and the candidate peak shaving threshold of the candidate combination;

(d3) deciding a plurality of candidate charge time intervals of the energy storage and a candidate charge power value of each of the candidate charge time intervals according to the first predicted load curve and the candidate customer base line of the candidate combination;

(d4) calculating an estimated energy storage amount of the energy storage at each of a plurality of time points according to an estimated initial energy storage amount of the energy storage, the candidate discharge power values, and the candidate charge power values;
(d5) determining whether all of the estimated energy storage amounts overlap with an energy storage amount range of the energy storage; and
(d6) taking the candidate combination as a qualified combination if all of the estimated energy storage amounts overlap with the energy storage amount range, or repeating the steps (d1) to (d6) if not all of the estimated energy storage amounts overlap with the energy storage amount range;
(e) determining whether the candidate customer base line corresponding to the qualified combination is the first one among the preset customer base lines;
(f) repeating the steps (c) to (f) if the candidate customer base line comprised in the qualified combination is not the first one among the preset customer base lines; and
(g) selecting the candidate peak shaving threshold and the candidate customer base line of one of the qualified combinations as the first peak shaving threshold and the first customer base line respectively.

19. The charge and discharge control method of claim 13, further comprising:
(a) deciding a plurality of preset peak shaving thresholds between the contracted capacity and the peak, wherein the preset peak shaving thresholds have an ascending order and a difference between the peak and each of the preset peak shaving thresholds is not greater than the maximum discharge power of the energy storage;
(b) deciding a plurality of preset customer base lines between the contracted capacity and the valley value, wherein the preset customer base lines have a descending order and a difference between each of the preset customer base lines and the valley value is not greater than the maximum charge power of the energy storage;
(c) selecting one of the preset customer base lines as a candidate customer base line according to the descending order;
(d) performing the following steps for the candidate customer base line:
(d1) selecting one of the preset peak shaving thresholds as a candidate peak shaving threshold according to the ascending order and taking the candidate peak shaving threshold and the candidate customer base line as a candidate combination;
(d2) deciding a plurality of candidate discharge time intervals of the energy storage and a candidate discharge power value of each of the candidate discharge time intervals according to the first predicted load curve and the candidate peak shaving threshold of the candidate combination;
(d3) deciding a plurality of candidate charge time intervals of the energy storage and a candidate charge power value of each of the candidate charge time intervals according to the first predicted load curve and the candidate customer base line of the candidate combination;
(d4) calculating an estimated energy storage amount of the energy storage at each of a plurality of time points according to an estimated initial energy storage amount of the energy storage, the candidate discharge power values, and the candidate charge power values;
(d5) determining whether all of the estimated energy storage amounts overlap with an energy storage amount range of the energy storage; and
(d6) taking the candidate combination as a qualified combination if all of the estimated energy storage amounts overlap with the energy storage amount range, or repeating the steps (d1) to (d6) if not all of the estimated energy storage amounts overlap with the energy storage amount range;
(e) determining whether the candidate peak shaving threshold corresponding to the qualified combination is the first one among the preset peak shaving thresholds; and
(f) repeating the steps (c) to (f) if the candidate peak shaving threshold corresponding to the qualified combination is not the first one among the preset peak shaving thresholds; and
(g) selecting the candidate peak shaving threshold and the candidate customer base line of one of the qualified combinations as the first peak shaving threshold and the first customer base line respectively.

20. The charge and discharge control method of claim 13, further comprising:
deciding an adjusted predicted load curve according to the first discharge time intervals, the first discharge power values, the first charge time intervals, the first charge power values, and the first predicted load curves, wherein the adjusted predicted load curve comprises a plurality of adjusted power values;
determining that a residual energy storage amount of the energy storage at the end of the first adjustment time interval is not zero;
deciding a residual energy release time interval in the first adjustment time interval, wherein the adjusted power values corresponding to the residual energy release time interval are greater than the first customer base line; and
deciding at least one residual energy release sub-time interval in the residual energy release time interval and a residual energy release power value corresponding to each of the at least one residual energy release sub-time interval according to the residual energy storage amount, the adjusted power values corresponding to the residual energy release time interval, and the first customer base line.

21. The charge and discharge control method of claim 13, further comprising:
deciding a plurality of second discharge time intervals of the energy storage and a second discharge power value of each of the second discharge time intervals according to a second peak shaving threshold and a second predicted load curve of the electric circuit in a second adjustment time interval; and
deciding a discharge power value of a scheduling time interval in the second adjustment time interval, wherein the second peak shaving threshold is between the contracted capacity and a peak of the second predicted load curve.

22. The charge and discharge control method of claim 21, further comprising:
determining that a residual energy storage amount of the energy storage at the end of the second adjustment time interval is not zero; and
deciding a residual energy release time interval, wherein the residual energy release time interval falls within the scheduling time interval.

23. The charge and discharge control method of claim 21, further comprising:
deciding a plurality of second charge time intervals of the energy storage and a second charge power value of each of the second charge time intervals according to the scheduling time interval, a second customer base line, and the second predicted load curve,
wherein the second charge time intervals do not fall within the scheduling time interval and the second customer base line is between the contracted capacity and a valley value of the second predicted load curve.

24. The charge and discharge control method of claim 23, further comprising:
determining that a residual energy storage amount of the energy storage at the end of the second adjustment time interval is not zero; and
deciding a residual energy release time interval, wherein the residual energy release time interval falls within the scheduling time interval.

* * * * *